US012316305B2

(12) United States Patent
Wijekoon et al.

(10) Patent No.: US 12,316,305 B2
(45) Date of Patent: May 27, 2025

(54) SWITCH ARRANGEMENT FOR A CONVERTER

(71) Applicant: HUAWEI TECHNOLOGIES CO., LTD., Guangdong (CN)

(72) Inventors: Piniwan Thiwanka Bandara Wijekoon, Nuremberg (DE); Anatolii Tcai, Nuremberg (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 60 days.

(21) Appl. No.: 18/316,349

(22) Filed: May 12, 2023

(65) Prior Publication Data

US 2023/0318593 A1    Oct. 5, 2023

Related U.S. Application Data

(63) Continuation of application No. PCT/EP2020/082113, filed on Nov. 13, 2020.

(51) Int. Cl.
    *H03K 17/041* (2006.01)
    *H03K 17/06* (2006.01)
    *H03K 17/66* (2006.01)

(52) U.S. Cl.
    CPC ....... *H03K 17/04113* (2013.01); *H03K 17/06* (2013.01); *H03K 17/66* (2013.01)

(58) Field of Classification Search
    CPC ......... H03K 7/04106; H03K 17/04113; H03K 17/06; H03K 17/66; H03K 2217/0009;
    (Continued)

(56) References Cited

U.S. PATENT DOCUMENTS 6,137,703 A   10/2000 Julian et al.
6,958,924 B2  10/2005 Gateau et al.
(Continued)

FOREIGN PATENT DOCUMENTS

CN   101409512 A  *  4/2009 .............. H02M 7/12
CN   101409512 B     6/2011
(Continued)

OTHER PUBLICATIONS

Kasunaidu Vechalapu et al., "Comparative performance evaluation of series connected 15 KV SiC IGBT devices and 15 kV SiC MOSFET devices for MV power conversion system", 2016 IEEE Energy Conversion Congress and Exposition (ECCE),2016,total 8 pages.
(Continued)

*Primary Examiner* — Jung Kim

(57) ABSTRACT

A switch arrangement for a converter comprises a first series connection of at least two semiconductor switches between two terminals of the switch arrangement. A second series connection of a first capacitor and a first diode circuit is electrically connected in parallel to first part of the first series connection between a first terminal of the two terminals and a node between the two switches. The switch arrangement is configured to provide a quasi-multilevel operation that switches the at least two switch pairs between a non-conducting state and a conducting state via at least one intermediate transient state that switches a first of at least two switch pairs before a second of the at least two switch pairs to thereby increase effective voltage capability of the at least two switch pairs between the two terminals of the switch arrangement.

20 Claims, 16 Drawing Sheets

(58) Field of Classification Search
CPC ............. H03K 17/107; H03K 17/6871; H03K 17/6874; H03K 17/102; H03K 17/687; H03K 17/10; H03K 17/122
See application file for complete search history.

(56) References Cited

U.S. PATENT DOCUMENTS

| | | |
|---|---|---|
| 9,246,407 B2 | 1/2016 | Schroeder et al. |
| 2014/0211520 A1 | 7/2014 | Zhang et al. |
| 2014/0293667 A1 | 10/2014 | Schroeder et al. |
| 2015/0214828 A1 | 7/2015 | Zhang et al. |
| 2016/0144561 A1 | 5/2016 | Nauka et al. |
| 2020/0195133 A1 | 6/2020 | Bonnano et al. |

FOREIGN PATENT DOCUMENTS

| | | |
|---|---|---|
| DE | 19725825 A1 | 1/1998 |
| EP | 1287609 B1 | 1/2012 |
| EP | 3329585 B1 | 9/2019 |
| WO | 0193412 A3 | 12/2001 |
| WO | 2022128134 A1 | 6/2022 |

OTHER PUBLICATIONS

International Search Report and Written Opinion issued in PCT Application No. PCT/EP2020/082113 dated Aug. 6, 2021.

\* cited by examiner

SWITCH ARRANGEMENT FOR A
CONVERTER

CROSS-REFERENCE TO RELATED
APPLICATIONS

This application is a continuation of International Application No. PCT/EP2020/082113, filed on Nov. 13, 2020, the disclosure of which is hereby incorporated by reference in its entirety.

TECHNICAL FIELD

The present disclosure relates to a switch arrangement for a converter; a method for switching such a switch arrangement between the conducting state and the non-conducting state; and a converter system with at least one converter comprising at least one such switch arrangement.

BACKGROUND

Medium/high voltage semiconductor switches are an important electric component for power electronic converters allowing to increase power, without the need of complex multilevel converter topologies using low voltage devices. However, availability of such medium/high voltage semiconductor switches is limited.

SUMMARY

Embodiments of the invention are based on the following considerations made by the inventors:

For achieving the functionality of medium/high voltage semiconductor switches, lower voltage class semiconductor switches that are electrically connected in series may be utilized. This technique may be used to implement both unidirectional semiconductor switches as well as bidirectional semiconductor switches for use in medium and high voltage power electronics applications. Semiconductor switches may be referred to as directional control switches (DCS). The terms "connected" and "electrically connected" may be used as synonyms.

A bidirectional semiconductor switch is configured to control current flow in two directions. Thus, the bidirectional semiconductor switch may also be referred to as bidirectional control switch (BCS). A bidirectional semiconductor switch may be implemented by one or more controlled semiconductor switches and optionally one or more diodes. The term "uncontrolled semiconductor switch" may be used as a synonym for the term "diode". The term "controlled semiconductor switch" may refer to a semiconductor switch comprising a control terminal, such as a transistor, a thyristor, triac etc. In particular, the one or more controlled semiconductor switches of a bidirectional semiconductor switch may be one or more transistors, such as one or more insulated-gate bipolar transistors (IGBTs), one or more field-effect transistors (FETs), one or more metal-oxide-semiconductor field-effect transistors (MOSFETs), one or more bipolar junction transistors (BJTs) and/or one or more junction gate field-effect transistors (JFETs). The term "diode" may refer to a semiconductor switch (without a control terminal) that allows only an unidirectional current flow, that is a current flow in only one direction, such as a p-n semiconductor diode, a pin diode, a Schottky diode, an intrinsic body diode of a respective device/transistor.

Examples of a bidirectional semiconductor switch are anti-serial (back-to-back) bidirectional semiconductor switches with common emitter or common collector, bidirectional semiconductor switch with a diode bridge, bidirectional semiconductor switch using reverse blocking IGBTs (RB-IGBT) etc. FIG. 1 shows such examples.

A unidirectional semiconductor switch is configured to control current flow in only one direction. Thus, the unidirectional semiconductor switch may also be referred to as unidirectional control switch (UCS). Examples of a unidirectional semiconductor switch are a MOSFET or an IGBT connected in series with a diode. FIG. 1 shows such examples.

Existing technologies of semiconductor switches, such as the switches shown in FIG. 1, have major limitation of maximum breakdown voltage possible with existing devices when used as a power switch in a converter. As outlined already above, to achieve switches of higher voltage levels (that is switches that are robust for higher voltage levels and, thus, may work at the higher volage levels), several low voltage semiconductor switches (i.e. semiconductor switches of lower voltage level) may be connected in series. The switch implemented by the series connection of the low voltage semiconductor switches corresponds to a switch of a higher voltage level compared to the voltage level for which each low voltage semiconductor switch is suitable for.

For switching a switch implemented by a plurality of low voltage semiconductor switches connected in series, all the low voltage semiconductor switches are switched at the same time. In this scenario proper dynamic voltage sharing across the low voltage semiconductor switches are achieved by prior device matching. In addition, snubber circuits are required, which are connected in parallel to each of the low voltage semiconductor switches. The snubber circuits are configured to suppress voltage transients when the low voltage semiconductor switches are switched together between the conducting and non-conducting states. For achieving a proper dynamic sharing across the low voltage semiconductor switches a precise tuning of the snubber circuits is additionally needed. Furthermore, gate driver level matching is required for the gate control devices of those semiconductor switches.

The aforementioned prior device matching of the low voltage semiconductor switches and precise tuning of the snubber circuits significantly increase the cost, complexity, volume of implementing medium/high power switches by a series connections of low voltage semiconductor switches. Moreover, these snubbers generate additional losses. Therefore, in high voltage applications, the aforementioned snubber circuits tend to be bulky and require refined cooling, which in terms increases the volume of the system and reduces the efficiency.

In view of the above-mentioned problems and disadvantages, embodiments of the disclosure aim to improve a switch arrangement comprising a series connection of semiconductor switches for implementing a switch, in particular used in a converter. An objective is to provide a switch arrangement that overcomes the above-mentioned problems and disadvantages.

The objective is achieved by the embodiments of the invention as described in the enclosed independent claims. Advantageous implementations of the embodiments of the invention are further defined in the dependent claims.

A first aspect of the present disclosure provides a switch arrangement for a converter. The switch arrangement comprises a first series connection of at least two switches between two terminals of the switch arrangement, wherein the two switches are semiconductor switches. The switch arrangement further comprises a second series connection of a first capacitor and a first diode circuit electrically connected in parallel to a first part of the first series connection between a first terminal of the two terminals and a node between the two switches, wherein the first diode circuit comprises at least one diode. The switch arrangement moreover comprises a third series connection of a second capacitor and a second diode circuit electrically connected in parallel to a second part of the first series connection between a second terminal of the two terminals and the node between the two switches, wherein the second diode circuit comprises at least one diode.

The first diode circuit, first capacitor, second diode circuit and second capacitor allow a separate switching of the at least two switches of the first series connection. As a result, a prior device matching of the at least two switches of the first series connection is not required. The first capacitor and second capacitor, which may be charged via the first diode and second diode circuit, when the at least two switches are in the non-conducting state, allow that a voltage between the two terminals of the switch arrangement is equally shared by the at least two switches of the first series connection. Since the first capacitor and second capacitor are used for intermediate voltages below the voltage between the two terminals of the switch arrangement and the first and second diode circuit are used for providing a current path for merely a charging current for charging the first and second capacitor, the first and second capacitor and the diodes of the first and second diode circuit are dimensioned for smaller voltage levels compared to electrical components of snubber circuits that are not required by the switch arrangement of the first aspect. As a result, the switch arrangement is less bulky and requires no refined cooling compared to circuits comprising snubber circuits, in particular in high voltage applications. Moreover the switch arrangement according to the first aspect does not require a prior device matching of the switches of the first series connection and no precise tuning of snubber circuits, which are not required by the switch arrangement of the first aspect. This significantly decreases the cost, complexity and volume for implementing medium/high power switches by the switch arrangement of the first aspect. In the light of the above, the switch arrangement of the first aspect overcomes the above-mentioned problems and disadvantages.

Since the volume is decreased for implementing the switch arrangement of the first aspect compared to circuits using snubber circuits, the switch arrangement may be used for high switching operation, that is for implementing switches for high switching operation. Namely, the compact design results in lower switching losses and faster switching times of the at least two switches of the first series connection.

Furthermore, using at least two switches of the first series connection connected in series between the two terminals of the switch arrangement instead of a single semiconductor switch, allows to use switches that are suited for lower voltage levels. That is, the blocking voltage of each switch of the first series connection may be less compared to the blocking voltage of a single semiconductor switch. This reduces costs and conduction losses. The conduction losses of a switch increases with the blocking voltage, because the resistance of the switch in the conducting state increases with the blocking voltage (e.g. resistance R α (Vblocking) 2.5).

The switch arrangement may be used for implementing respectively realizing a semiconductor switch respectively power switch of a converter. In particular, the switch arrangement may be used for implementing a unidirectional semiconductor switch or a bidirectional semiconductor switch. In particular, the switch arrangement may be used for implementing a solid state switch with bidirectional control.

The term "power converter" or "power electronics converter" may be used as a synonym for the term "converter".

The switch arrangement may be used for an AC/DC converter, a DC/AC converter, a DC/DC converter and an AC/AC converter. In particular, the switch arrangement may be used for a T-Type converter, e.g. a 3-Level T-Type converter; a Nested T-Type converter, e.g. a 3-Level Nested T-Type converter or a 5-Level Nested T-Type converter; a Heric converter; a Vienna converter/rectifier; and a Matrix converter. The switch arrangement may be used for further power electronics converter topologies known by the skilled person.

In particular, the switch arrangement may be used for implementing at least one bidirectional semiconductor switch that is arranged in a T-Type converter or Vienna converter/rectifier for connecting the neutral point delivered by two DC-link capacitors arranged at the output of the T-Type converter or Vienna rectifier.

The switch arrangement may be referred to by the term semiconductor switch arrangement.

In an implementation form of the first aspect, the switches of the switch arrangement (i.e. the at least two switches) are bidirectional semiconductor switches.

This may be the case for realizing a bidirectional semiconductor switch by the switch arrangement.

In an implementation form of the first aspect, at least one switch of the switches of the switch arrangement (i.e. of the at least two switches) is a unidirectional semiconductor switch. In particular, the switches of the switch arrangement (i.e. the at least two switches) may be unidirectional semiconductor switches. This may be the case for realizing a unidirectional semiconductor switch by the switch arrangement.

In other words, the first series connection comprises an even integer number of switches greater or equal to two. That is, the even integer number of switches may be two, four, six, eight, etc. That is, the first series connection may comprise two switches, four switches, six switches, eight switches etc.

In other words, the second series connection is electrically connected in parallel to the first part of the first series connection between the first terminal and a node at the center of the first series connection, which is a center node of the first series connection; and the third series connection is electrically connected in parallel to the second part of the first series connection between the second terminal and the center node of the first series connection. In case the first series connection comprises two switches, the node between the two switches is the center node of the first series connection. The term "central node" and "center node" may be used as synonyms.

The node (between two electrical components) at the center of a series connection of an even integer number of electrical components is a node between two electrical components that is equally apart/distant in terms of nodes from both ends of the series connection of the electrical components. The passage "in terms of nodes" is to be understood as "in terms of the number of nodes". The node at the center of a series connection of an even integer number of electrical components may also be referred to as the center node of the series connection. In other words, the center node of the series connection of the electrical components corresponds to a node between two electrical components that is arranged such that the number of nodes between the center node and a first end of the series connection equals to the number of nodes between the center node and a second end of the series connection. Therefore, in case of the first series connection, the center node of the first series connection is a node between two switches of the first series connection that is arranged such that the number of nodes between the center node and the first terminal equals to the number of nodes between the center node and the second terminal. In the case of only two switches said number of nodes is zero nodes.

The first diode circuit may be connected to the first terminal and the first capacitor may be connected to the node between the two switches. Alternatively, the first capacitor may be connected to the first terminal and the first diode circuit may be connected to the node between the two switches. The second diode circuit may be connected to the second terminal and the second capacitor may be connected to the node between the two switches. Alternatively, the second capacitor may be connected to the second terminal and the second diode circuit may be connected to the node between the two switches.

The at least two switches may be connected in series between the two terminals, such that, in the conducting state of the two switches, the two switches allow a unidirectional current flow from the first to the second terminal.

The at least one diode of the first diode circuit may be arranged respectively electrically connected in the second series connection such that the at least one diode of the first diode circuit allows an unidirectional current flow of a charging current from the first terminal to the node between the two switches of the first series connection. In particular, the at least one diode of the first diode circuit may be arranged, such that its anode is electrically connected to the first terminal or its cathode is electrically connected to the node between two switches of the first series connection. In other words, the at least one diode of the first diode circuit may be arranged respectively electrically connected in the second series connection such that its cathode is directed towards the node between the two switches of the first series connection.

In case a diode of a series connection of electrical components is arranged at any position in the series connection and its cathode is directed towards a node of the series connection, such as an end (end node) of the series connection, this is to be understood as the diode being arranged in the series connection such that the cathode of the diode shows into the direction of the node. Therefore, in case the diode is connected to the node, the cathode of the diode is connected to the node. Correspondingly, in case the diode is arranged in the series connection such that its anode is directed towards the node, this is to be understood as the diode being arranged in the series connection such that the anode of the diode shows into the direction of the node. Therefore, in case the diode is connected to the node, the anode of the diode is connected to the node.

The at least one diode of the second diode circuit may be arranged respectively electrically connected in the third series connection such that the at least one diode of the second diode circuit allows an unidirectional current flow of a charging current from the node between the two switches of the first series connection to the second terminal. In particular, the at least one diode of the second diode circuit may be arranged, such that its cathode is electrically connected to the second terminal or its anode is electrically connected to the node between the two switches of the first series connection. In other words, the at least one diode of the second diode circuit may be arranged respectively electrically connected in the third series connection such that its anode is directed towards the node between the two switches of the first series connection.

In an implementation form of the first aspect, the first series connection comprises an even integer number of switches greater or equal to four, wherein the switches are semiconductor switches. The second series connection and third series connection each may be electrically connected to a node at the center of the first series connection, which is a center node of the first series connection. The first capacitor of the second series connection and the second capacitor of the third series connection may be electrically connected to the center node of the first series connection. The first diode circuit and the second diode circuit each may comprise a number of diodes equalling to half of the even integer number of the switches; and the diodes of each of the first diode circuit and the second diode circuit may be electrically connected in series to each other.

The higher the number of switches of the first series connection, the lower the voltage level may be for which each switch is suited for. That is, the higher the number of switches of the first series connection, the lower the blocking voltage of each switch may be. This reduces costs and conduction losses. Since no prior device matching of the switches of the first series connection is needed, as outlined above, a higher number of switches does not increase the complexity of implementing the switch arrangement.

The even integer number of switches may be two, four, six, eight, etc. That is, the first series connection may comprise two switches, four switches, six switches, eight switches etc.

The switches may be connected in series between the two terminals such that in the conducting state of the switches, the switches allow an unidirectional current flow from the first terminal of the two terminals to the second terminal of the two terminals.

The diodes of the first diode circuit may be arranged respectively electrically connected in the second series connection such that the diodes of the first diode circuit allow an unidirectional current flow of a charging current from the first terminal to the center node of the first series connection. In other words, the diodes of the first diode circuit may be arranged respectively electrically connected in the second series connection such that the cathode of each diode of the first diode circuit is directed towards the center node of the first series connection.

The diodes of the second diode circuit may be arranged respectively electrically connected in the third series connection such that the diodes of the second diode circuit allow an unidirectional current flow of a charging current from the center node of the first series connection to the second terminal. In other words, the diodes of the second diode circuit may be arranged respectively electrically connected in the third series connection such that the anode of each diode of the second diode circuit is directed towards the center node of the first series connection.

In an implementation form of the first aspect, the switch arrangement comprises a third diode circuit and a fourth diode circuit each comprising at least one diode. The first capacitor of the second series connection and the second capacitor of the third series connection may be electrically connected to the node between the two switches. The third diode circuit may be electrically connected between the first terminal and a node between the second capacitor and the second diode circuit. The fourth diode circuit may be electrically connected between the second terminal and a node between the first capacitor and the first diode circuit. The at least one diode of the third diode circuit may be arranged in antiparallel to the at least one diode of the first diode circuit; and the at least one diode of the fourth diode circuit may be arranged in antiparallel to the at least one diode of the second diode circuit.

The third diode circuit and the fourth diode circuit allow the switch arrangement to be used as a bidirectional switch, because they allow together with the first and second diode circuit a charging of the first capacitor and the second capacitor both from the first terminal to the second terminal and from the second terminal to the first terminal.

The switches of the first series connection may be bidirectional switches. This allows to implement a bidirectional switch by the switch arrangement.

The at least one diode of the third diode circuit may be arranged respectively electrically connected such that the at least one diode of the third diode circuit allows an unidirectional current flow of a charging current from the node between the two switches of the first series connection to the first terminal. In particular, the cathode of the at least one diode of the third diode circuit may be electrically connected to the first terminal. In other words, the at least one diode of the third diode circuit may be arranged respectively electrically connected such that its cathode is directed towards the first terminal.

The at least one diode of the fourth diode circuit may be arranged respectively electrically connected such that the at least one diode of the fourth diode circuit allows an unidirectional current flow of a charging current from the second terminal to the node between the two switches of the first series connection. In particular, the anode of the at least one diode of the fourth diode circuit may be electrically connected to the second terminal. In other words, the at least one diode of the fourth diode circuit may be arranged respectively electrically connected such that its anode is directed towards the second terminal.

In an implementation form of the first aspect, the first series connection comprises an even integer number of switches greater or equal to four, wherein the switches are semiconductor switches. The second series connection and third series connection each may be electrically connected to a node at the center of the first series connection, which is a center node of the first series connection. The first capacitor of the second series connection and the second capacitor of the third series connection may be electrically connected to the center node of the first series connection. The first diode circuit, the second diode circuit, the third diode circuit and the fourth diode circuit each may comprise a number of diodes equaling to half of the even integer number of the switches. The diodes of each of the first diode circuit, the second diode circuit, the third diode circuit and the fourth diode circuit may be electrically connected in series to each other.

The higher the number of switches of the first series connection, the lower the blocking voltage of each switch may be. This reduces costs and conduction losses. Since no prior device matching of the switches of the first series connection is needed, as outlined above, a higher number of switches does not increase the complexity of implementing the switch arrangement.

The diodes of the third diode circuit may be arranged respectively electrically connected such that the diodes of the third diode circuit allow an unidirectional current flow of a charging current from the center node of the first series connection to the first terminal. In other words, the diodes of the third diode circuit may be arranged respectively electrically connected with each other in series such that the cathode of each diode of the third diode circuit is directed towards the first terminal.

The diodes of the fourth diode circuit may be arranged respectively electrically connected such that the diodes of the fourth diode circuit allow an unidirectional current flow of a charging current from the second terminal to the center of the first series connection. In other words, the diodes of the fourth diode circuit may be arranged respectively electrically connected with each other in series such that the anode of each diode of the fourth diode circuit is directed towards the second terminal.

In an implementation form of the first aspect, the switch arrangement comprises for each node between two diodes of the first diode circuit and the second diode circuit, and optionally the third diode circuit and fourth diode circuit, a third capacitor. Each node between two diodes of the first diode circuit, and optionally the third diode circuit, may be electrically connected via the respective third capacitor to a node between two switches of a first part of the first series connection between the first terminal and the center node of the first series connection, such that the respective node between two diodes is arranged in the series connection of the diodes of the respective diode circuit at the same position as the position of the node between two switches in the first part of the first series connection, to which the respective node between two diodes is electrically connected to. Each node between two diodes of the second diode circuit, and optionally the fourth diode circuit, may be electrically connected via the respective third capacitor to a node between two switches of a second part of the first series connection between the center node of the first series connection and the second terminal, such that the respective node between two diodes is arranged in the series connection of the diodes of the respective diode circuit at the same position as the position of the node between two switches in the second part of the first series connection, to which the respective node between two diodes is electrically connected to.

The third capacitors allow a voltage balancing of the voltages applied to each switch of the first series connection when a voltage is applied to the two terminals of the switch arrangement.

In an implementation form of the first aspect, the first capacitor and the second capacitor comprise the same capacity.

In an implementation form of the first aspect, third capacitors electrically connected to the same node between two switches of the first series connection comprise the same capacity.

Optionally all capacitors of the switch arrangement comprise the same capacity.

In an implementation form of the first aspect, the diodes of the switch arrangement are configured to provide a current path for a charging current for charging the first capacitor and the second capacitor, when all of the switches are in the non-conducting state.

In particular, when all of the switches are in the non-conducting state, the one or more diodes of the first diode circuit and the one or more diodes of the second diode circuit may provide the current path for the charging current from the first terminal to the second terminal. In particular, the one or more diodes of the first diode circuit may provide the current path for the charging current from the first terminal to the first capacitor. The one or more diodes of the second diode circuit may provide the current path for the charging current from the second capacitor to the second terminal.

Thus, the current path for the charging current may be provided from the first terminal via the one or more diodes of the first diode circuit, the first capacitor, the second capacitor and the one or more diodes of the second diode circuit to the second terminal.

When all of the switches are in the non-conducting state, the one or more diodes of the optional fourth diode circuit and the one or more diodes of the optional third diode circuit may provide the current path for the charging current from the second terminal to the first terminal. In particular, the one or more diodes of the fourth diode circuit may provide the current path for the charging current from the second terminal to the first capacitor. The one or more diodes of the third diode circuit may provide the current path for the charging current from the second capacitor to the first terminal. Thus, the current path for the charging current may be provided from the second terminal via the one or more diodes of the optional fourth diode circuit, the first capacitor, the second capacitor and the one or more diodes of the optional third diode circuit to the first terminal.

In an implementation form of the first aspect, for switching the switch arrangement between the conducting state and the non-conducting state, the switches are configured to be controlled such that at least two switches of the switches are not switched at the same time between the conducting state and the non-conducting state.

Therefore, no prior device matching of the switches of the first series connection is required, which is advantageous for the reasons provided above.

In the conducting state of the switch arrangement, all of the switches of the switch arrangement are in the conducting state, and in the non-conducting state of the switch arrangement all of the switches of the switch arrangement are in the non-conducting state. Thus, in the conducting state of the switch arrangement a current path for a load current is provided via all of the switches between the two terminals of the switch arrangement. In case that at least one switch of the switches is a unidirectional switch, the current path is unidirectional. In case of the switches being bidirectional, the current path is bidirectional. In the non-conducting state of the switch arrangement no current path for a load current is provided by the switch arrangement. Therefore, the conducing state of the switch arrangement corresponds to the conducting state of a single semiconductor switch and the non-conducting state of the switch arrangement corresponds to the non-conducting state of a single semiconductor switch. The non-conducting state may also be referred to as the "zero state" or "off state". The conducting state may also be referred to as the "on state". The passages "to switch to the conducting state" and "to turn on" may be used as synonyms. The passages "to switch to the non-conducting state" and "to turn off" may be used as synonyms.

In an implementation form of the first aspect, for switching the switch arrangement between the conducting state and the non-conducting state, the switches are configured to be controlled such that the switches are switched successively one after the other, according to the order in the first series connection, between the conducting state and the non-conducting state.

Therefore, no prior device matching of the switches of the first series connection is required, which is advantageous for the reasons provided above.

In particular, this may be the case, when the switch arrangement comprises two switches respectively when the switch arrangement comprises an even integer number of switches that is equal to two.

In an implementation form of the first aspect, for switching the switch arrangement between the conducting state and the non-conducting state, the switches are configured to be controlled such that a switch of the switches electrically connected to one of the two terminals is switched at first between the conducting-state and the non-conducting state.

In particular, this may be the case, when the switch arrangement comprises two switches respectively when the switch arrangement comprises an even integer number of switches that is equal to two.

In an implementation form of the first aspect, in case the first series connection comprises an even integer number of switches greater or equal to four:
  two switches, which are equally apart in terms of nodes from the center node of the first series connection, are a switch pair such that the first series connection comprises a plurality of switch pairs; and
  for switching the switch arrangement between the conducting state and the non-conducting state, the switches are configured to be controlled such that
    the two switches of at least one switch pair of the plurality of switch pairs are switched at the same time between the conducting state and the non-conducting state, and
    the two switches of each switch pair of the other switch pairs of the plurality of switch pairs are switched after each other.

In other words, two switches of the first series connection correspond to a switch pair, when the number of nodes between each switch of the two switches and the center node of the first series connection is the same. That is, the number of nodes between a first switch of the two switches and the center node and the number of nodes between the second switch of the two switches and the center node are equal to each other.

In an implementation form of the first aspect, for switching the switch arrangement between the conducting state and the non-conducting state, the switches are configured to be controlled such that the two switches of each switch pair of the plurality of switch pairs are switched at the same time between the conducting state and the non-conducting state, wherein at least two switch pairs of the plurality of switch pairs are not switched at the same time between the conducting state and the non-conducting state.

In an implementation form of the first aspect, for switching the switch arrangement from the conducting state to the non-conducting state, the switches are configured to be controlled such that
  the switch pair comprising two switches electrically connected to the two terminals of the switch arrangement
  or
  the switch pair comprising two switches electrically connected to the center node of the first series connection
is switched at first from the conducting state to the non-conducting state and the other switch pairs of the plurality of switch pairs are successively switched one after the other, according to the order of the other switch pairs in the first series connection, from the conducting state to the non-conducting state.

Switching the switches of the first series connection from the conducting state to the non-conducting state such that at first the switch pair comprising the two switches electrically connected to the two terminals of the switch arrangement is switched, allows to charge respective capacitors of the switch arrangement. Switching the switches of the first series connection from the conducting state to the non-conducting state such that at first the switch pair comprising the two switches electrically connected to the center node of the first series connection is switched, allows to discharge respective capacitors of the switch arrangement.

For switching the switch arrangement from the non-conducting state to the conducting state, the switches may be configured to be controlled such that the switch pair comprising the two switches electrically connected to the two terminals of the switch arrangement or the switch pair comprising the two switches electrically connected to the center node of the first series connection is switched at first from the non-conducting state to the conducting state and the other switch pairs of the plurality of switch pairs are successively switched one after the other, according to the order of the other switch pairs in the first series connection, from the non-conducting state to the conducting state.

Switching the switches of the first series connection from the non-conducting state to the conducting state such that at first the switch pair comprising the two switches electrically connected to the two terminals of the switch arrangement is switched, allows to discharge respective capacitors of the switch arrangement. Switching the switches of the first series connection from the non-conducting state to the conducting state such that at first the switch pair comprising the two switches electrically connected to the center node of the first series connection is switched, allows to charge respective capacitors of the switch arrangement.

Therefore, controlling which switch pair of the switch pairs is switched at first allows to control charging and discharging of respective capacitors of the switch arrangement and, thus, the charging states respective voltages of the respective capacitors. This allows to control the voltage balancing of the voltages applied to the switches of the first series connection, because the voltages applied to the switches of the first series connection are dependent on the voltage between the two terminals of the switch arrangement and the voltages of the first capacitor, second capacitor and optional third capacitors.

In an implementation form of the first aspect, for switching the switch arrangement from the conducting state to the non-conducting state and from the non-conducting state to the conducting state, the switches are configured to be controlled such that the switching is started with the switch pair comprising the two switches electrically connected to the two terminals of the switch arrangement, or the switch pair comprising the two switches electrically connected to the center node of the first series connection.

This allows to keep the charging state of respective capacitors of the switch arrangement constant at respective charging states. Namely, in case of switching the switch pair comprising the two switches electrically connected to the two terminals of the switch arrangement at first, a charging of the capacitors, when switching the switch arrangement and, thus, the switch pairs after each other from the conducting state to the non-conducting state is followed by a discharging of the respective capacitors, when switching the switch arrangement and, thus, the switch pairs after each other from the non-conducting state to the conducting state. In case of switching the switch pair comprising the two switches electrically connected to the center node of the first series connection at first, a discharging of the respective capacitors, when switching the switch arrangement and, thus, the switch pairs after each other from the conducting state to the non-conducting state is followed by a charging of the respective capacitors, when switching the switch arrangement and, thus, the switch pairs after each other from the non-conducting state to the conducting state In order to achieve the switch arrangement according to the first aspect of the present disclosure, some or all of the implementation forms and optional features of the first aspect, as described above, may be combined with each other.

A second aspect of the present disclosure provides a method for switching a switch arrangement according to the first aspect or any of its implementation forms, as described above, between the conducting state and the non-conducting state. The method comprises the step of controlling the switches of the switch arrangement such that at least two switches of the switches are not switched at the same time between the conducting state and the non-conducting state.

The method of the second aspect and its implementation forms and optional features achieve the same advantages as the switch arrangement of the first aspect and its respective implementation forms and respective optional features.

The implementation forms and optional features of the switch arrangement according to the first aspect are correspondingly valid for the method according to the second aspect.

In an implementation form of the second aspect, the method comprises the step of controlling the switches of the switch arrangement such that the switches are switched successively one after the other, according to the order in the first series connection, between the conducting state and the non-conducting state.

In an implementation form of the second aspect, the method comprises the step of controlling the switches of the switch arrangement such that a switch of the switches electrically connected to one of the two terminals is switched at first between the conducting-state and the non-conducting state.

In an implementation form of the second aspect, in case the first series connection of the switch arrangement comprises an even integer number of switches greater or equal to four, the method comprises the step of controlling the switches of the switch arrangement such that the two switches of at least one switch pair of the plurality of switch pairs are switched at the same time between the conducting state and the non-conducting state, and the two switches of each switch pair of the other switch pairs of the plurality of switch pairs are switched after each other.

In an implementation form of the second aspect, in case the first series connection of the switch arrangement comprises an even integer number of switches greater or equal to four, the method comprises the step of controlling the switches of the switch arrangement such that the two switches of each switch pair of the plurality of switch pairs are switched at the same time between the conducting state and the non-conducting state, wherein at least two switch pairs of the plurality of switch pairs are not switched at the same time between the conducting state and the non-conducting state.

In an implementation form of the second aspect, in case the first series connection of the switch arrangement comprises an even integer number of switches greater or equal to four, the method comprises the step of controlling the switches of the switch arrangement such that the switch pair comprising two switches electrically connected to the two terminals of the switch arrangement or the switch pair comprising two switches electrically connected to the center node of the first series connection is switched at first from the conducting state to the non-conducting state and the other switch pairs of the plurality of switch pairs are successively switched one after the other, according to the order of the other switch pairs in the first series connection, from the conducting state to the non-conducting state, in order to switch the switch arrangement from the conducting state to the non-conducting-state.

Further, the method may comprise the step of controlling the switches of the switch arrangement such that
the switch pair comprising the two switches electrically connected to the two terminals of the switch arrangement or
the switch pair comprising the two switches electrically connected to the center node of the first series connection
is switched at first from the non-conducting state to the conducting state and the other switch pairs of the plurality of switch pairs are successively switched one after the other, according to the order of the other switch pairs in the first series connection, from the non-conducting state to the conducting state, in order to switch the switch arrangement from the non-conducting state to the conducting-state.

In an implementation form of the second aspect, in case the first series connection of the switch arrangement comprises an even integer number of switches greater or equal to four, the method comprises the step of controlling the switches of the switch arrangement such that the switching is started with
the switch pair comprising the two switches electrically connected to the two terminals of the switch arrangement, or
the switch pair comprising the two switches electrically connected to the center node of the first series connection,
for switching the switch arrangement from the conducting state to the non-conducting state and from the non-conducting state to the conducting state.

In order to achieve the method according to the second aspect of the present disclosure, some or all of the implementation forms and optional features of the second aspect, as described above, may be combined with each other.

A third aspect of the present disclosure provides a converter system with at least one converter. The at least one converter comprises at least one switch arrangement according to the first aspect or any of its implementation forms, as described above, for controlling power conversion by the at least one converter.

The converter system of the third aspect and its implementation forms and optional features achieve the same advantages as the switch arrangement of the first aspect and its respective implementation forms and respective optional features.

The implementation forms and optional features of the switch arrangement according to the first aspect are correspondingly valid for the converter system according to the third aspect.

In an implementation form of the third aspect, the converter system comprises a control unit. The control unit is configured to control power conversion by the at least one converter by performing the method according to the second aspect or any of its implementation forms, as described above, for switching the at least one switch arrangement of the at least one converter between the conducting state and the non-conducting state.

A fourth aspect of the present disclosure provides a control unit configured to control switching of at least one switch arrangement according to the first aspect or any of its implementation forms, as described above, by performing the method according to the second aspect or any of its implementation forms, as described above.

A fifth aspect of the present disclosure provides a converter comprising at least one switch arrangement according to the first aspect or any of its implementation forms, as described above, for controlling power conversion by the converter.

The at least one converter of the converter system according to the third aspect and the converter according to the fifth aspect may be an AC/DC converter, a DC/AC converter, a DC/DC converter and/or an AC/AC converter. In particular, the at least one converter of the converter system according to the third aspect and the converter according to the fifth aspect may be a T-Type converter, e.g. a 3-Level T-Type converter; a Nested T-Type converter, e.g. a 3-Level Nested T-Type converter or a 5-Level Nested T-Type converter; a Heric converter; a Vienna converter/rectifier; and/or a Matrix converter.

A sixth aspect of the present disclosure provides a computer program comprising a program code for performing the method according to the second aspect or any of its implementation forms, as described above.

A seventh aspect of the present disclosure provides a non-transitory storage medium storing executable program code which, when executed by a control unit, causes the method according to the second aspect or any of its implementation forms, as described above, to be performed.

The control unit of the converter system according to an implementation form of the third aspect, the control unit according to the fourth aspect and the control unit for executing the program code stored by the non-transitory medium according to the seventh aspect may comprise or correspond to a processor, a microprocessor, a controller, a microcontroller, a field programmable gate array (FPGA), an application specific integrated circuit (ASIC) or any combination of them.

An eighth aspect of the present disclosure provides a switch arrangement for a converter. The switch arrangement comprises an even integer number of switches greater or equal to two, wherein the switches are semiconductor switches, and two diode circuits, each comprising a number of diodes equaling to the even integer number of the switches. The switches are electrically connected in series to each other between two terminals of the switch arrangement. The diodes of a first diode circuit of the two diode circuits are electrically connected in series to each other between the two terminals of the switch arrangement. The diodes of a second diode circuit of the two diode circuits are electrically connected in series to each other between the two terminals of the switch arrangement. The series connection of the diodes of the first diode circuit, the series connection of the diodes of the second diode circuit and the series connection of the switches are electrically connected in parallel to each other. The diodes of the first diode circuit of the two diode circuits are electrically connected in series such that the cathode of each diode of the first diode circuit is directed towards a node at the center of the series connection of the diodes of the first diode circuit. The node at the center of the series connection of the diodes of the first diode circuit corresponds to the center node of the first diode circuit. That is, in case the first diode circuit comprises two diodes, the anode of a first diode of the two diodes may be electrically connected to a first terminal of the two terminals, the cathode of the first diode may be connected to the cathode of the second diode of the two diodes and the anode of the second diode may be connected to the second terminal of the two terminals. In case the first diode circuit comprises at least four diodes, the two or more diodes between the first terminal and the center node of the first diode circuit may be connected such that the cathode of the diodes is connected to the anode of another diode or to the center node of the first diode circuit; and the two or more diodes between the second terminal and the center node of the first diode circuit may be connected such that the cathode of the diodes is connected to the anode of another diode or to the center node of the first diode circuit. The diodes of the second diode circuit of the two diode circuits are electrically connected in series such that the anode of each diode of the second diode circuit is directed towards a node at the center of the series connection of the diodes of the second diode circuit. The node at the center of the series connection of the diodes of the second diode circuit corresponds to the center node of the second diode circuit. That is, in case the second diode circuit comprises two diodes, the cathode of a first diode of the two diodes may be electrically connected to the first terminal, the anode of the first diode may be connected to the anode of the second diode of the two diodes and the cathode of the second diode may be connected to the second terminal. In case the second diode circuit comprises at least four diodes, the two or more diodes between the first terminal and the center node of the second diode circuit may be connected such that the anode of the diodes is connected to the cathode of another diode or to the center node of the second diode circuit; and the two or more diodes between the second terminal and the center node of the second diode circuit may be connected such that the anode of the diodes is connected to the cathode of another diode or to the center node of the second diode circuit. The switch arrangement comprises for each node between two diodes of the two diode circuits a capacitor. Each node between two diodes of the two diode circuits is electrically connected via the respective capacitor to a node between two switches of the series connection of the switches, such that the respective node between two diodes is arranged in the series connection of the diodes of the respective diode circuit at the same position as the position of the node between two switches in the series connection of the switches, to which the respective node between two diodes is connected to.

The switch arrangement of the eight aspect may be used for implementing respectively realising a semiconductor switch, in particular a bidirectional semiconductor switch, of a converter.

In an implementation form of the eight aspect, the switches are bidirectional semiconductor switches.

A ninth aspect of the present disclosure provides a switch arrangement for a converter. The switch arrangement comprises two switches electrically connected in series to each other between two terminals of the switch arrangement such that, in the conducting state of the two switches, the two switches allow an unidirectional current flow from a first terminal of the two terminals to a second terminal of the two terminals. The two switches are semiconductor switches. The switch arrangement further comprises a first diode and a first capacitor electrically connected in series between the first terminal and a node between the two switches, wherein the cathode of the first diode is directed towards the node between the two switches. The switch arrangement further comprises a second diode and a second capacitor electrically connected in series between the second terminal and the node between the two switches, wherein the anode of the second diode is directed towards the node between the two switches. The series connection of the first diode and the first capacitor is electrically connected in parallel to a first switch of the two switches, wherein the first switch is electrically connected to the first terminal. The series connection of the second diode and the second capacitor is electrically connected in parallel to a second switch of the two switches, wherein the second switch is electrically connected to the second terminal.

The switch arrangement of the ninth aspect may be used for implementing respectively realising a semiconductor switch, in particular a unidirectional semiconductor switch, of a converter.

The passage "the cathode of the first diode is directed towards the node between the two switches" means that the cathode of the first diode is electrically connected with the node between the two switches or that the anode of the first diode is electrically connected with the first terminal. The passage "the anode of the second diode is directed towards the node between the two switches" means that the anode of the second diode is electrically connected with the node between the two switches or that the cathode of the second diode is electrically connected with the second terminal.

Thus, the anode of the first diode may be connected to the first terminal and the cathode of the first diode may be connected to the first capacitor. Alternatively, the first capacitor may be connected to the first terminal, the anode of the first diode may be connected to the first capacitor and the cathode of the first diode may be connected to the node between the two switches. The cathode of the second diode may be connected to the second terminal and the anode of the second diode may be connected to the second capacitor. Alternatively, the second capacitor may be connected to the second terminal, the cathode of the second diode may be connected to the second capacitor and the anode of the second diode may be connected to the node between the two switches.

In an implementation form of the ninth aspect, at least one switch of the two switches is a unidirectional semiconductor switch. In particular, the two switches may be unidirectional semiconductor switches.

A tenth aspect of the present disclosure provides a switch arrangement for a converter. The switch arrangement comprises an even integer number of switches greater or equal to four, wherein the switches are semiconductor switches, and two diode circuits each comprising a number of diodes equaling to half of the even integer number of the switches. The switches are electrically connected in series to each other between two terminals of the switch arrangement such that, in the conducting state of the switches, the switches allow an unidirectional current flow from a first terminal of the two terminals to a second terminal of the two terminals. A node at the center of the series connection of the switches is a center node of the series connection of the switches. The diodes of each diode circuit of the two diode circuits are electrically connected in series to each other. The series connection of the diodes of a first diode circuit of the two diode circuits is electrically connected on one end to the first terminal and on the other end via a first capacitor to the center node of the series connection of the switches. The series connection of the diodes of the first diode circuit and the first capacitor is electrically connected in parallel to a first part of the series connection of the switches between the first terminal and the center node of the series connection of the switches. The diodes of the first diode circuit are electrically connected in series such that the cathode of each diode of the first diode circuit is directed towards the center node of the series connection of the switches. That is, in case the first diode circuit comprises two diodes, the anode of a first diode of the two diodes may be electrically connected to the first terminal, the cathode of the first diode may be connected to the anode of the second diode of the two diodes and the cathode of the second diode may be connected to the first capacitor. In case the first diode circuit comprises at least three diodes, the anode of a first diode of the at least three diodes may be electrically connected to the first terminal and the cathode of a second diode of the at least three diodes may be electrically connected to the first capacitor. The one or more further diodes of the first diode circuit may be electrically connected such that the anode of each diode of the one or more further diodes is connected to a cathode of a preceding diode and the cathode of each diode of the one or more further diodes is connected to an anode of a subsequent diode.

The series connection of the diodes of a second diode circuit of the two diode circuits is electrically connected on one end to the second terminal and on the other end via a second capacitor to the center node of the series connection of the switches. The series connection of the diodes of the second diode circuit and the second capacitor is electrically connected in parallel to a second part of the series connection of the switches between the second terminal and the center node of the series connection of the switches. The diodes of the second diode circuit are electrically connected in series such that the anode of each diode of the second diode circuit is directed towards the center node of the series connection of the switches. That is, in case the second diode circuit comprises two diodes, the cathode of a first diode of the two diodes may be electrically connected to the second terminal, the anode of the first diode may be connected to the cathode of the second diode of the two diodes and the anode of the second diode may be connected to the second capacitor. In case the second diode circuit comprises at least three diodes, the cathode of a first diode of the at least three diodes may be electrically connected to the second terminal and the anode of a second diode of the at least three diodes may be electrically connected to the second capacitor. The one or more further diodes of the second diode circuit may be electrically connected such that the anode of each diode of the one or more further diodes is connected to a cathode of a preceding diode and the cathode of each diode of the one or more further diodes is connected to an anode of a subsequent diode.

The switch arrangement of the tenth aspect may be used for implementing respectively realising a semiconductor switch, in particular a unidirectional semiconductor switch, of a converter.

In an implementation form of the tenth aspect, at least one switch of the switches of the switch arrangement is a unidirectional semiconductor switch. In particular, the switches of the switch arrangement may be unidirectional semiconductor switches.

In an implementation form of the tenth aspect, the switch arrangement comprises for each node between two diodes of the two diode circuits a third capacitor. Each node between two diodes of the first diode circuit is electrically connected via the respective third capacitor to a node between two switches of the first part of the series connection of the switches, such that the respective node between two diodes is arranged in the series connection of the diodes of the first diode circuit at the same position as the position of the node between two switches in the first part of the series connection of the switches, to which the respective node between two diodes is connected to. Each node between two diodes of the second diode circuit is electrically connected via the respective third capacitor to a node between two switches of the second part of the series connection of the switches, such that the respective node between two diodes is arranged in the series connection of the diodes of the second diode circuit at the same position as the position of the node between two switches in the second part of the series connection of the switches, to which the respective node between two diodes is connected to.

In an implementation form of the eighth aspect, ninth aspect and tenth aspect, capacitors electrically connected to the same node between two switches of the series of the switches comprise the same capacity.

In an implementation form of the ninth and tenth aspect, the first capacitor and the second capacitor comprise the same capacity.

In an implementation form of the eighth aspect, ninth aspect and tenth aspect, the diodes of the switch arrangement are configured to provide a current path for a charging current for charging capacitors electrically connected to a node at the center of the series connection of the switches, when all of the switches are in the non-conducting state.

In an implementation form of the ninth aspect, the first diode and the second diode are configured to provide a current path for a charging current for charging the first capacitor and the second capacitor, when all of the switches are in the non-conducting state.

In an implementation form of the tenth aspect, the diodes of the switch arrangement are configured to provide a current path for a charging current for charging the first capacitor and the second capacitor, when all of the switches are in the non-conducting state.

The implementation forms and optional features of the switch arrangement according to the first aspect are correspondingly valid for the switch arrangement according to the eighth aspect, ninth aspect and tenth aspect. In particular, the implementation forms and optional features regarding the switches of the switch arrangement according to the first aspect are correspondingly valid for the switches of the switch arrangement according to the eighth aspect, ninth aspect and tenth aspect.

In order to achieve the switch arrangement according to the eighth aspect, some or all of the implementation forms and optional features of the eighth aspect, as described above, may be combined with each other. In order to achieve the switch arrangement according to the ninth aspect, some or all of the implementation forms and optional features of the ninth aspect, as described above, may be combined with each other. In order to achieve the switch arrangement according to the tenth aspect, some or all of the implementation forms and optional features of the tenth aspect, as described above, may be combined with each other.

The method of the second aspect or any of its implementation forms may be used for switching, between the conducting state and the non-conducting state, a switch arrangement according to the eighth aspect or any of its implementation forms,
a switch arrangement according to the ninth aspect or any of its implementation forms, and
a switch arrangement according to the tenth aspect or any of its implementation forms.

The control unit according to the fourth aspect, the converter according to the fifth aspect, the computer program according to the sixth aspect, the non-transitory storage medium according to the seventh aspect, the switch arrangement according to the eighth aspect, the switch arrangement according to the ninth aspect and the switch arrangement according to the tenth aspect each achieve the same advantages as the switch arrangement of the first aspect.

It has to be noted that all devices, elements, units and means described in the present application could be implemented in software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementation forms of the disclosure will be explained in the following description of specific embodiments in relation to the enclosed drawings, in which.

In the Figures corresponding elements are labeled with the same reference sign.

DETAILED DESCRIPTION OF EMBODIMENTS

Figure 1:
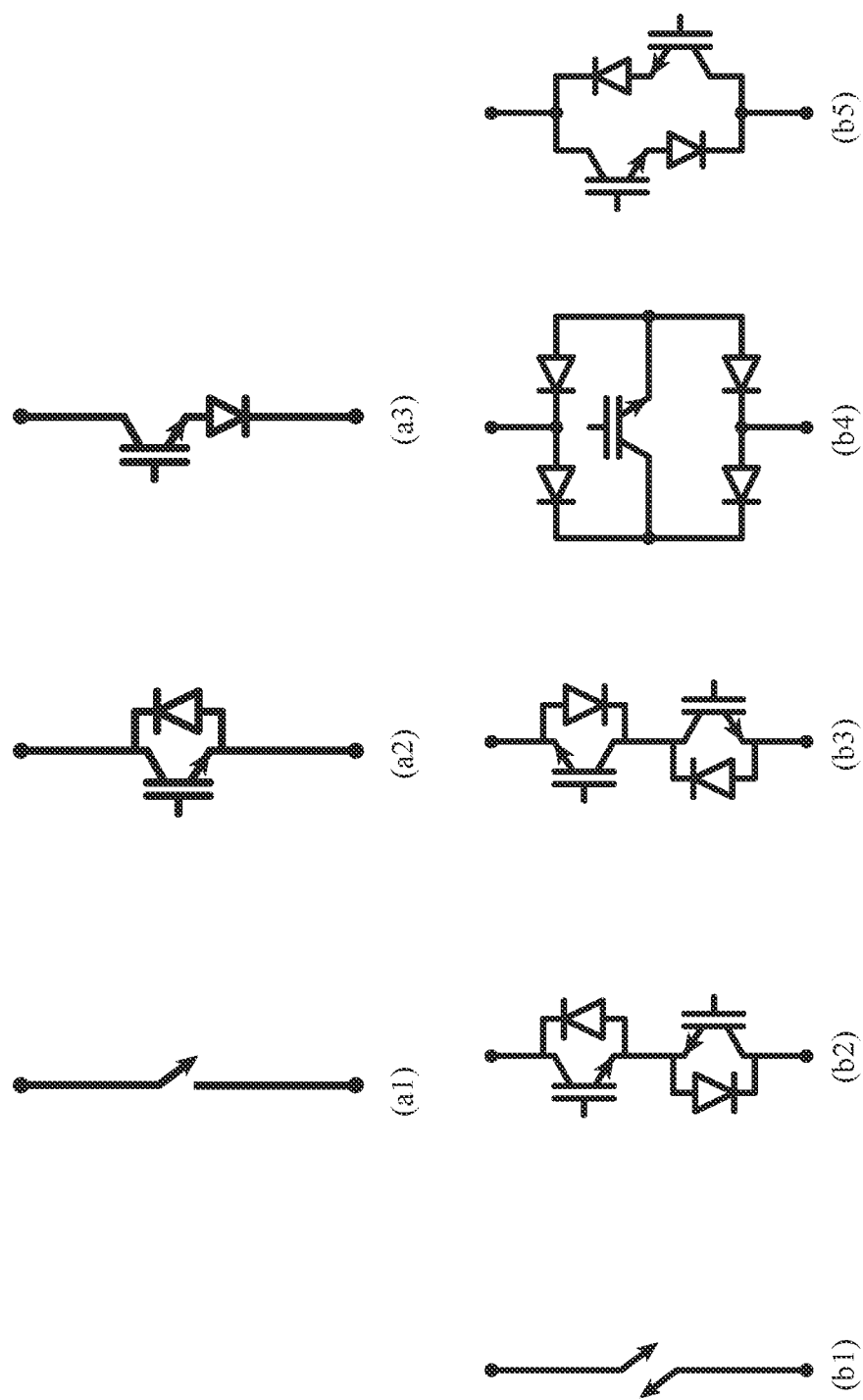
FIG. 1 shows examples of unidirectional semiconductor switches (cf. (a1), (a2) and (a3)) and examples of bidirectional semiconductor switches (cf. (b1), (b2), (b3), (b4) and (b5))

FIG. 1 shows examples of unidirectional semiconductor switches (cf. (a1), (a2) and (a3)) and examples of bidirectional semiconductor switches (cf. (b1), (b2), (b3), (b4) and (b5)).

FIG. 1 (a1) shows a symbol used for a unidirectional control switch (UCS) respectively a unidirectional semiconductor switch. FIGS. 1 (a2) and (a3) show two possible implementations of a unidirectional semiconductor switch, wherein FIG. 1 (a2) shows an IGBT with a diode connected in anti-parallel and FIG. 1 (a3) shows an IGBT with a diode connected in series.

FIG. 1 (b1) shows a symbol used for a bidirectional control switch (BCS) respectively a bidirectional semiconductor switch. FIGS. 1 (b2) to (b5) show various possible implementations of a bidirectional semiconductor switch. The configurations shown in FIGS. 1 (b2) and (b3) are referred to as anti-serial (back-to-back) bidirectional semiconductor switches implemented by two IGBTs with common emitter (as shown in FIG. 1 (b2)) or with common collector (as shown in FIG. 1 (b3)). The configuration, shown in FIG. 1 (b4) is referred to as bidirectional semiconductor switch with a diode bridge, wherein the bidirectional semiconductor switch may be formed by a diode bridge and an IGBT. The configuration, shown in FIG. 1 (b5), may be referred to as antiparallel bidirectional semiconductor switch using reverse blocking IGBTs (RB-IGBTs).

The bidirectional semiconductor switches may be used to control current in both directions. The common collector configuration of the anti-serial bidirectional semiconductor switch, shown in FIG. 1 (b3), requires a separate isolated gate driver for each power switch, whereas a single driver can be sufficient for the common emitter configuration, with the cost separate control of the current direction. The bidirectional semiconductor switch with a diode bridge is composed of a single power switch and four diodes and, thus, requires only one gate driver. The antiparallel bidirectional semiconductor switch requires additional diodes for each current direction and a separate gate driver of each power switch.

FIGS. 2 to 7 show switch arrangements according to embodiments of the invention.

Figure 2:
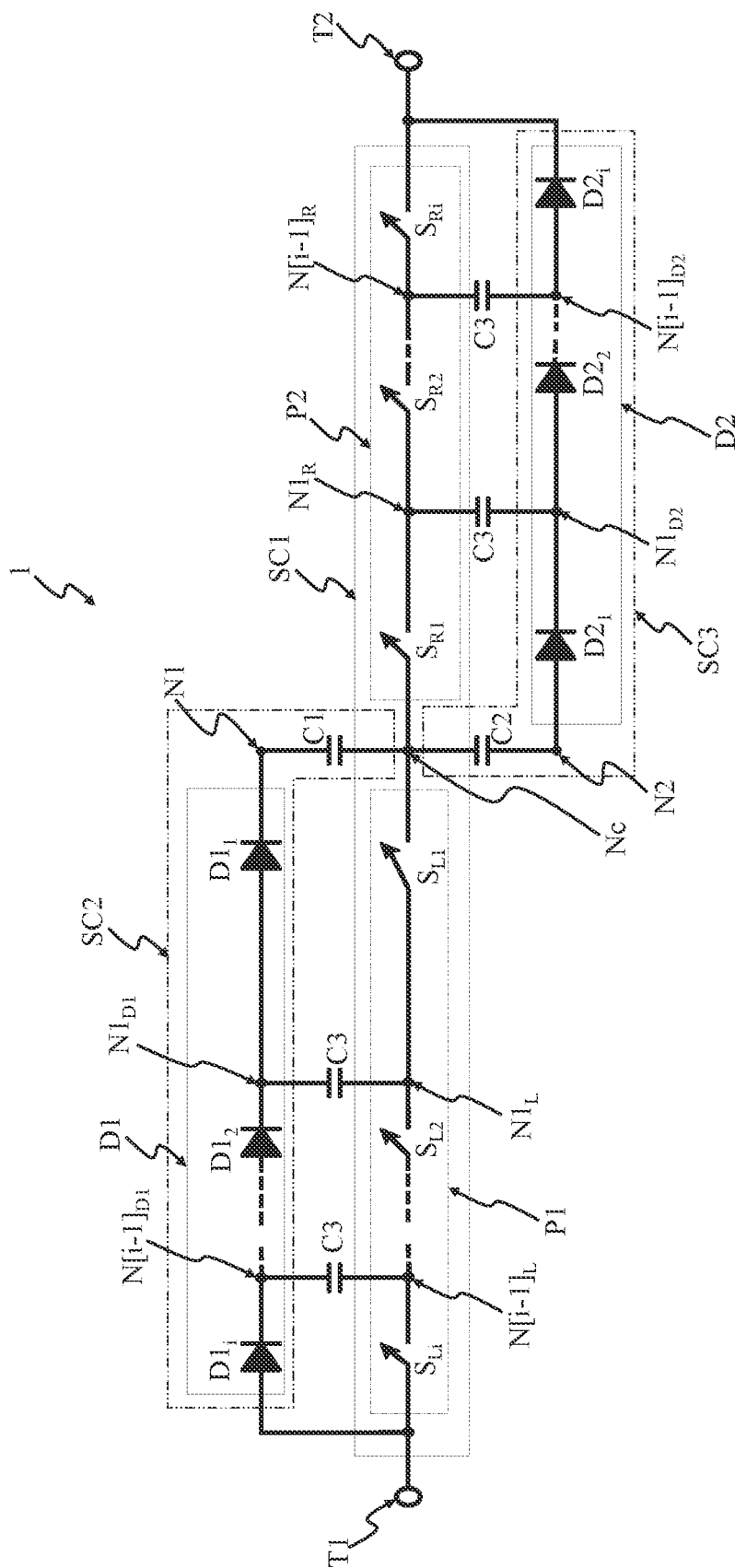
FIGS. 2 to 7 show switch arrangements according to example of the invention.

FIG. 2 shows an embodiment of the switch arrangement according to the first aspect and an embodiment of the switch arrangement according to the tenth aspect.

Thus, the above description with respect to the switch arrangement of the first aspect and the switch arrangement of the tenth aspect is correspondingly valid for the switch arrangement of FIG. 2.

Figure 3:
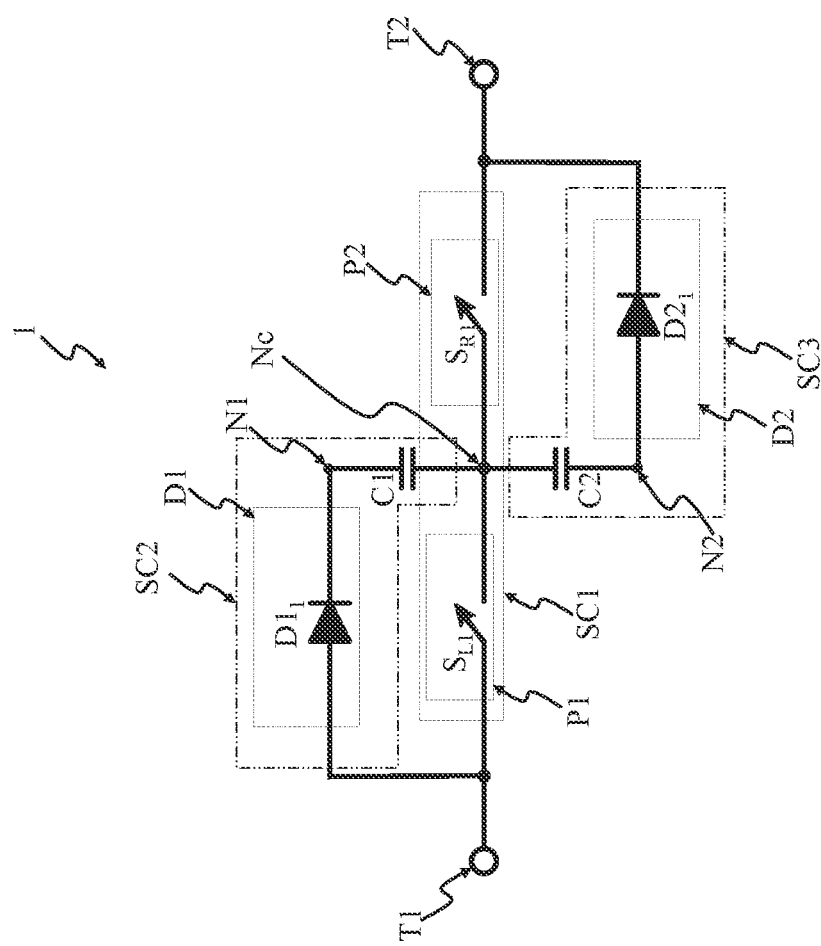
Figure 4:
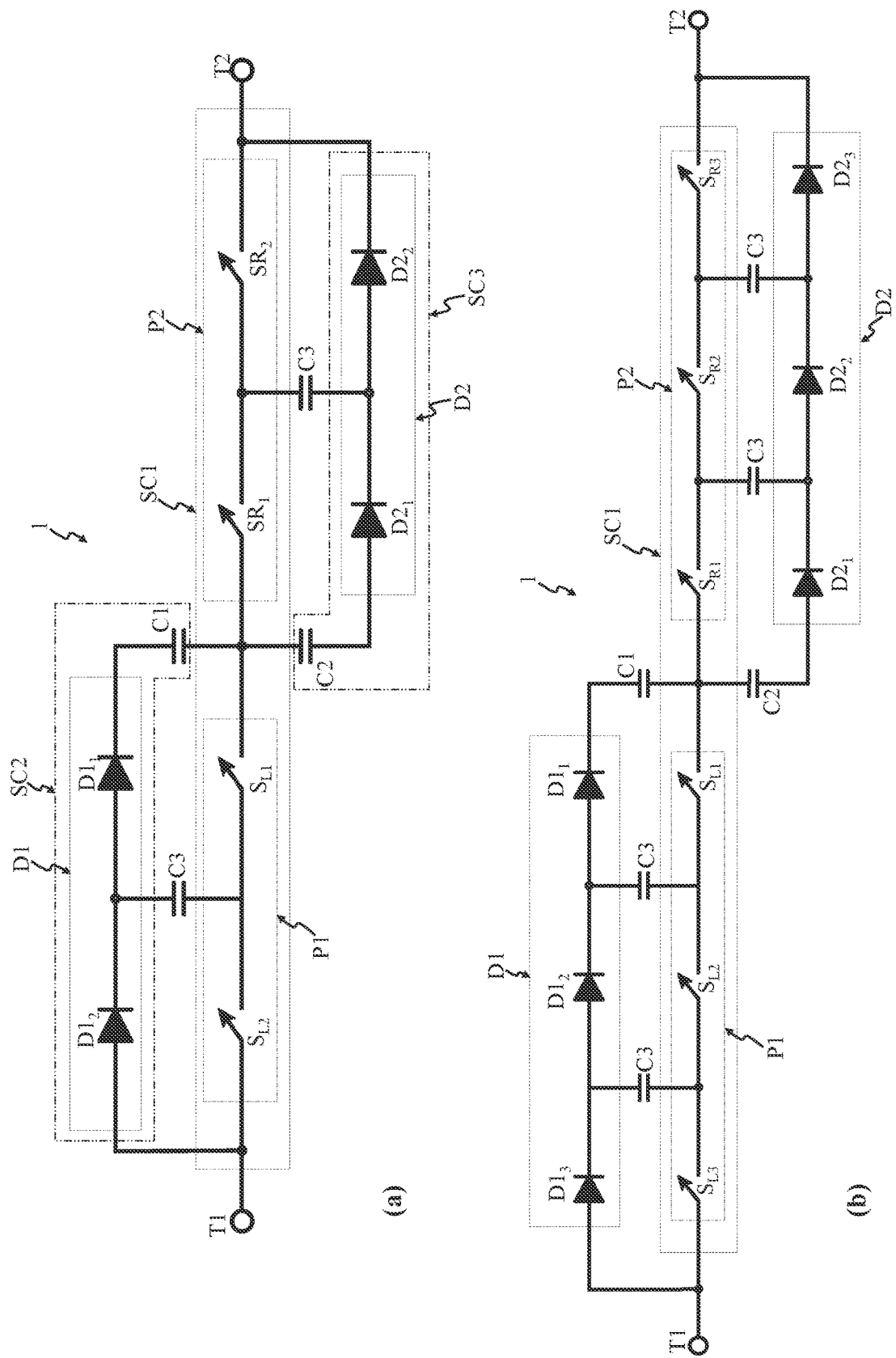

As shown in FIG. 2, the switch arrangement 1 comprises a first series connection SC1 of an even integer number of switches SLi, . . . , SL2, SL1, SR1, SR2, . . . , SRi greater or equal to two between two terminals T1, T2 of the switch arrangement 1, wherein the switches SLi, . . . , SL2, SL1, SR1, SR2, . . . , SRi are semiconductor switches. As indicated in FIG. 2, the switches SLi, . . . , SL2, SL1, SR1, SR2, . . . , SRi are unidirectional semiconductor switches. Alternatively, at least one switch of the switches SLi, . . . , SL2, SL1, SR1, SR2, . . . , SRi may be a bidirectional semiconductor switch. The even integer number of switches may be equal to two (this case is shown in FIG. 3), four (this case is shown in FIG. 4 (a)), six (this case is shown in FIG. 4 (b)) or to an even integer number greater than the aforementioned numbers. The switch arrangement 1 may also be referred to as nested directional switch (NDS), in particular as N-level nested directional switch (N-level NDS), wherein N is the even integer number of switches SLi, . . . , SL2, SL1, SR1, SR2, . . . , SRi of the first series connection SC1 of the switch arrangement 1. That is, a switch arrangement comprising two switches SL1, SR1 corresponds to a 2-level NDS, a switch arrangement comprising four switches SL2, SL1, SR1, SR2 corresponds to a 4-level NDS, a switch arrangement comprising six switches SL3, SL2, SL1, SR1, SR2, SR3 corresponds to a 6-level NDS etc. The switch arrangement 1 shown in FIG. 2 corresponds to a unidirectional semiconductor switch, which may also be called nested unidirectional switch.

The switch arrangement 1 of FIG. 2 may comprise an even integer number of low voltage semiconductor switches SLi, ..., SL2, SL1, SR1, SR2, ..., SRi greater or equal to two for achieving between the terminals T1 and T2 a switch with a higher blocking voltage compared to the blocking voltage of each of the low voltage semiconductor switches. The total blocking capability of the switch arrangement, i.e. of the achieved switch between the terminals T1 and T2, is equal to the even integer number of switches SLi, ..., SL2, SL1, SR1, SR2, ..., SRi of the switch arrangement multiplied by the blocking capability Vblock of each of the switches SLi, ..., SL2, SL1, SR1, SR2, ..., SRi (2*(i)*Vblock, wherein i is an integer number greater or equal to 1). The switch arrangement 1 comprises 2*i semiconductor switches (i is an integer number greater or equal to 1) to achieve the switch with a higher blocking voltage compared to the blocking voltage of each of the semiconductor switches.

The switch arrangement 1 further comprises a second series connection SC2 of a first capacitor C1 and a first diode circuit D1, wherein the second series connection SC2 is electrically connected in parallel to a first part P1 of the first series connection SC1 between a first terminal T1 of the two terminals T1, T2 and a node Nc at the center of the first series connection SC1, which is a center node of the first series connection SC1. The switch arrangement 1 also comprises a third series connection SC3 of a second capacitor C2 and a second diode circuit D2, wherein the third series connection SC3 is electrically connected in parallel to a second part P2 of the first series connection SC1 between a second terminal T2 of the two terminals T1, T2 and the center node Nc of the first series connection SC1.

As shown in FIG. 2, the first capacitor C1 of the second series connection SC2 and the second capacitor C2 of the third series connection SC3 are electrically connected to the center node Nc of the first series connection SC1. The first diode circuit D1 is connected between the first terminal T1 and the first capacitor C1, wherein the node between the first diode circuit D1 and the first capacitor C1 is labelled with the reference sign N1. The second diode circuit D2 is connected between the second terminal T2 and the second capacitor C2, wherein the node between the second diode circuit D2 and the second capacitor C2 is labelled with the reference sign N2.

The first diode circuit D1 comprises a number (i) of diodes D1i, ..., D12, D11 equaling to half of the even integer number (2*i) of the switches SLi, ..., SL2, SL1, SR1, SR2, ..., SRi. That is the first diode circuit D1 comprises at least one diode. In case the first diode circuit D1 comprises two or more diodes, the diodes are electrically connected in series to each other. As shown in FIG. 2, the diodes D1i, ..., D12, D11 of the first diode circuit D1 are electrically connected in series to each other such that the cathode of each of the diodes D1i, ..., D12, D11 is directed towards the center node Nc of the first switching circuit SC1 and, thus, towards the first capacitor C1. In other words, the diodes D1i, ..., D12, D11 of the first diode circuit D1 are electrically connected such that the cathode of a diode of the first diode circuit D1 is electrically connected to the anode of another diode (as it is the case for the diodes D1i and D12) or to the first capacitor C1 (as it is the case for the Diode D11). Therefore, the diodes D1i, ..., D12, D11 of the first diode circuit D1 allow a unidirectional current flow of a charging current from the first terminal T1 to the center node Nc of the first series connection SC1 for charging the first and second capacitor C1, C2, when the switches SLi, ..., SL2, SL1, SR1, SR2, ..., SRi of the first series connection SC1 are in the non-conducting state.

The second diode circuit D2 comprises a number (i) of diodes D21, D22, ..., D2i equaling to half of the even integer number (2*i) of the switches SLi, ..., SL2, SL1, SR1, SR2, ..., SRi. That is the second diode circuit D2 comprises at least one diode. In case the second diode circuit D2 comprises two or more diodes, the diodes are electrically connected in series to each other. As shown in FIG. 2, the diodes D21, D22, ..., D2i of the second diode circuit D2 are electrically connected in series to each other such that the anode of each of the diodes D21, D22, ..., D2i is directed towards the center node Nc of the first switching circuit SC1 and, thus, towards the second capacitor C2. In other words, the diodes D21, D22, ..., D2i of the second diode circuit D2 are electrically connected such that the anode of a diode of the second diode circuit D2 is electrically connected to the cathode of another diode (as it is the case for the diodes D22 and D2i) or to the second capacitor C2 (as it is the case for the Diode D21). Therefore, the diodes D21, D22, ..., D2i of the second diode circuit D2 allow a unidirectional current flow of a charging current from the center node Nc of the first series connection SC1 to the second terminal T2 for charging the first and second capacitor C1, C2, when the switches SLi, ..., SL2, SL1, SR1, SR2, ..., SRi of the first series connection SC1 are in the non-conducting state.

As shown in FIG. 2, the switch arrangement 1 may comprise for each node N[i−1]D1, ..., N1D1, N1D2, ..., N[i−1]D2 between two diodes of the first diode circuit D1 and the second diode circuit D2 an optional third capacitor C3. Each node between two diodes of the first diode circuit D1 is electrically connected via the respective third capacitor C3 to a node between two switches of the first part P1 of the first series connection SC1 such that the respective node between two diodes is arranged in the series connection of the diodes D1i, ..., D12, D11 of the first diode circuit D1 at the same position as the position of the node between two switches in the first part P1 of the first series connection SC1, to which the respective node between two diodes is electrically connected to. For example the node N1D1 between the two diodes $D1_2$ and $D1_1$ of the first diode circuit D1 is arranged in the series connection of the diodes $D1_i$, ..., $D1_2$, $D1_1$ of the first diode circuit D1 at the same position as the position of the node $N1_L$ between the two switches $S_{L2}$ and $S_{L1}$ in the first part P1 of the first series connection SC1. Therefore, the node $N1_{D1}$ between the two diodes $D1_2$ and $D1_1$ of the first diode circuit D1 is connected via a third capacitor C3 to the node $N1_L$ between the two switches $S_{L2}$ and $S_{L1}$ of the first part P1 of the first series connection SC1.

Each node (e.g. node $N1_{D2}$) between two diodes of the second diode circuit D2 is electrically connected via the respective third capacitor C3 to a node (e.g. node $N1_R$) between two switches of a second part P2 of the first series connection SC1 between the center node Nc of the first series connection SC1 and the second terminal T2, such that the respective node (e.g. node $N1_{D2}$) between two diodes is arranged in the series connection of the diodes $D2_1$, $D2_2$, ..., $D2_i$ of the second diode circuit D2 at the same position as the position of the node (e.g. node $N1_R$) between two switches in the second part P2 of the first series connection SC1, to which the respective node (e.g. node $N1_{D2}$) between two diodes is electrically connected to.

In the light of the above, the number of switches, diodes and third capacitors C3 shown in FIG. 2 is only by way of example and does not limit the present disclosure.

The switch arrangement 1 may be switched between the conducting state and the non-conducting state by performing the method of the second aspect or any of its implementation forms. Therefore, the above description of the method of the second aspect is valid for describing the switching of the switch arrangement 1 between the conducting state and the non-conducting state.

According to an embodiment, for switching the switch arrangement 1 between the conducting state and the non-conducting state the switches SLi, . . . , SL2, SL1, SR1, SR2, . . . , SRi are controlled such that the switches SLi, . . . , SL2, SL1, SR1, SR2, . . . , SRi are switched successively one after the other, according to the order in the first series connection SC1, between the conducting state and the non-conducting state. In particular, the switches SLi, . . . , SL2, SL1, SR1, SR2, . . . , SRi may be controlled such that the switch SLi connected to the first terminal T1 or the switch SRi connected to the second terminal is switched at first between the conducting state and the non-conducting state. This switching is exemplarily shown in FIGS. 11 and 12. Thus, for switching the switch arrangement 1 between the conducting state and the non-conducting state the switch arrangement is switched in one or more transient states (may also be referred to as intermediate states).

The one or more transient states last only for several tens or hundreds of nanoseconds. By creating a delay between the switching of the switches SLi, . . . , SL2, SL1, SR1, SR2, . . . , SRi (i.e. switching the switches not at the same time but after each other), the transient states are created and, thus, the voltage between the terminals T1 and T2 may be equally shared by the switches SLi, . . . , SL2, SL1, SR1, SR2, . . . , SRi. Thus, the present disclosure proposes a quasi-multilevel operation of the switch arrangement (i.e. switching between the conducting state and the non-conducting state via one or more transient states dependent on the number of switches of the switch arrangement) to increase the effective voltage capability between the two terminals T1 and T2 of the switch arrangement.

During the transient states of the switch arrangement 1 only a charging current flows across one or more diodes and one or more capacitors of the switch arrangement 1. Therefore, the diodes of the switch arrangement 1 are rated for a much smaller current compared to the current for which the semiconductor switches SLi, . . . , SL2, SL1, SR1, SR2, . . . , SRi are rated for. The diodes are used to maintain the capacitor charge of the first capacitor C1, second capacitor C2 and optional third capacitors C3. During the transient states of the switch arrangement 1 the first capacitor C1, second capacitor C2 and optional third capacitors C3 may be charged or discharged. That is the capacitors of the switch arrangement 1 are operated during the transient states and, thus, only during a very short time. Therefore, the volume of the first capacitor C1, second capacitor C2 and optional third capacitors C3 may be very small.

In case the first series connection comprises an even integer number of switches SLi, . . . , SL2, SL1, SR1, SR2, . . . , SRi that is equal or greater to four switches, two switches that are equally apart in terms of nodes from the center node Nc of the first series connection SC1, are a switch pair such that the first series connection SC1 comprises a plurality of switch pairs. For example, the switches SL1 and SR1 are equally apart in terms of nodes from the center node Nc and, thus, are a switch pair, because they are connected to the center node Nc and, thus, zero nodes are present between each of said two switches SL1, SR1 and the center node Nc. The switches SL2 and SR2 are equally apart in terms of nodes from the center node Nc and, thus, are a switch pair, because one node (node N1L respectively N1R) is present between each of said two switches SL2, SR2 and the center node Nc.

According to an embodiment, for switching the switch arrangement 1 from the conducting state to the non-conducting state, the switches SLi, . . . , SL2, SL1, SR1, SR2, . . . , SRi are controlled such that the switch pair comprising the two switches SLi, SRi electrically connected to the two terminals T1 and T2 of the switch arrangement 1 or the switch pair comprising the two switches SL1, SR1 electrically connected to the center node Nc of the first series connection SC1 is switched at first from the conducting state to the non-conducting state and the other switch pairs of the plurality of switch pairs are successively switched one after the other, according to the order of the other switch pairs in the first series connection SC1, from the conducting state to the non-conducting state.

Accordingly, for switching the switch arrangement 1 from the non-conducting state to the conducting state, the switches SLi, . . . , SL2, SL1, SR1, SR2, . . . , SRi may be controlled such that the switch pair comprising the two switches SLi, SRi electrically connected to the two terminals T1, T2 of the switch arrangement 1 or the switch pair comprising the two switches SL1, SR1 electrically connected to the center node Nc of the first series connection SC1 is switched at first from the non-conducting state to the conducting state and the other switch pairs of the plurality of switch pairs are successively switched one after the other, according to the order of the other switch pairs in the first series connection SC1, from the non-conducting state to the conducting state.

The above switching method may be illustrated in the following Table 1, wherein a "1" indicates that a switch is in the conducting state and a "0" indicates that a switch is in the non-conducting state:

TABLE 1

Switching sequences for switching the switch arrangement

| | $S_{Li}$, $S_{L[i-1]}$, . . . , $S_{L2}$, $S_{L1}$, $S_{R1}$, $S_{R2}$, . . . , $S_{R[i-1]}$, $S_{Ri}$ | | state of switch arrangement |
|---|---|---|---|
| ↑ | 0, 0, . . . , 0, 0, 0, 0, . . . , 0, 0 | ↑ | non-conducting state |
| ↑ | 1, 0, . . . , 0, 0, 0, 0, . . . , 0, 1  0, 0, . . . , 0, 1, 1, 0, . . . , 0, 0 | ↑ | transient state |
| A  ↓ | 1, 1, . . . , 0, 0, 0, 0, . . . , 1, 1  0, 0, . . . , 1, 1, 1, 1, . . . , 0, 0 | ↓ B | transient state |
| ↓ | . . .  . . . | ↓ | transient state(s) |
| | 1, 1, . . . , 1, 0, 0, 1, . . . , 1, 1  0, 1, . . . , 1, 1, 1, 1, . . . , 1, 0 | | transient state |
| | 1, 1, . . . , 1, 1, 1, 1, . . . , 1, 1 | | conducting state |

When the switching sequence A of the left sub-column of the above Table 1 is used for switching the switch arrangement 1 from the non-conducting state to the conducting state (i.e. switching at first the switch pair comprising the switches SLi, SRi connected to the terminals T1, T2 to the conducting state), respective capacitors of the switch arrangement 1 are discharged during the transient states. When the switching sequence B of the right sub-column of the above Table 1 is used for switching the switch arrangement 1 from the non-conducting state to the conducting state (i.e. switching at first the switch pair comprising the switches SL1, SR1 connected to the center node Nc to the conducting state), respective capacitors of the switch arrangement 1 are charged during the transient states.

When the switching sequence A of the left sub-column of the above Table 1 is used for switching the switch arrangement 1 from the conducting state to the non-conducting state (i.e. switching at first the switch pair comprising the switches SL1, SR1 connected to the center node Nc to the non-conducting state), respective capacitors of the switch arrangement 1 are discharged during the transient states. When the switching sequence B of the right sub-column of the above Table 1 is used for switching the switch arrangement 1 from the conducting state to the non-conducting state (i.e. switching at first the switch pair comprising the switches SLi, SRi connected to the terminals T1, T2 to the non-conducting state), respective capacitors of the switch arrangement are charged during the transient states.

For circularly charging and discharging the capacitors, when switching the switch arrangement 1 between the conducting state and non-conducting the switching sequence A and B may be alternately used for switching the switch arrangement 1 between the conducting state and the non-conducting state.

As shown in Table 1, when switching the switch pairs between the conducting state and the non-conducting state the two switches of each switch pair are switched at the same time between the conducting state and the non-conducting state.

Alternatively, the two switches of at least one (that is one or more) switch pair may be switched after each other. This is exemplarily shown in the following Table 2, wherein for the switching sequence A exemplarily the two switches $S_{L1}$ and $S_{R1}$ forming a switch pair are switched after each other and for the switching sequence B exemplarily the two switches $S_{Li}$ and $S_{Ri}$ forming a switch pair are switched after each other.

Therefore, the above description of the switch arrangement of FIG. 2 is correspondingly valid for the switch arrangement of FIG. 3 and for describing the switch arrangement of FIG. 3 mainly reference is made to the above description of FIG. 2. In the following additional information with regard to the embodiment of FIG. 3 is provided.

As shown in FIG. 3, the center node Nc of the first series connection SC1 is the node between the two switches SL1 and SR1 of the first series connection SC1. According to FIG. 3, the first diode circuit D1 and the first capacitor C1 of the second series connection SC2 are connected such that the first diode circuit D1, in particular the anode of the diode D1$_1$ of the first diode circuit D1, is connected to the first terminal T1, and the first capacitor C1 is connected to the center node Nc. In the case of the first series connection SC1 comprising only two switches, the first diode circuit D1 and the first capacitor C1 may alternatively be connected such that the first capacitor C1 is connected to the first terminal T1 and the first diode circuit D1, in particular the cathode of the diode D1$_1$ of the first diode circuit D1, is connected to the center node Nc.

According to FIG. 3, the second diode circuit D2 and the second capacitor C2 of the third series connection SC3 are connected such that the second diode circuit D2, in particular the cathode of the diode D2$_1$ of the second diode circuit D2, is connected to the second terminal T2, and the second capacitor C2 is connected to the center node Nc. In the case of the first series connection SC1 comprising only two switches, the second diode circuit D2 and the second capacitor C2 may alternatively be connected such that the second capacitor C2 is connected to the second terminal T2 and the second diode circuit D2, in particular the anode of the diode D2$_1$ of the second diode circuit D2, is connected to the center node Nc.

FIG. 4 shows two embodiments of the switch arrangement according to the first aspect and two embodiments of the switch arrangement according to the tenth aspect.

Thus, the above description with respect to the switch arrangement of the first aspect and the switch arrangement of the tenth aspect is correspondingly valid for the switch arrangements of FIG. 4.

TABLE 2

Switching sequences for switching the switch arrangement

| $S_{Li}$, $S_{L[i-1]}$, . . . , $S_{L2}$, $S_{L1}$, $S_{R1}$, $S_{R2}$, . . . , $S_{R[i-1]}$, $S_{Ri}$ | state of switch arrangement |
|---|---|
| ↑           0, 0, . . . , 0, 0, 0, 0, . . . , 0, 0        ↑ | non-conducting state |
| ↑  1, 0, . . . , 0, 0, 0, 0, . . . , 0, 1   0, 0, . . . , 0, 1, 1, 0, . . . , 0, 0 ↑ | transient state |
| A ↑  1, 1, . . . , 0, 0, 0, 0, . . . , 1, 1   0, 0, . . . , 1, 1, 1, 1, . . . , 0, 0 ↑ B | transient state |
| ↓        . . .               . . .       ↓ | transient state(s) |
| ↓  1, 1, . . . , 1, 0, 0, 1, . . . , 1, 1   0, 1, . . . , 1, 1, 1, 1, . . . , 1, 0 ↓ | transient state |
| ↓  1, 1, . . . , 1, 1, 0, 1, . . . , 1, 1   1, 1, . . . , 1, 1, 1, 1, . . . , 1, 0 ↓ | optional transient state |
| OR               OR | |
| 1, 1, . . . , 1, 0, 1, 1, . . . , 1, 1   0, 1, . . . , 1, 1, 1, 1, . . . , 1, 1 | |
| 1, 1, . . . , 1, 1, 1, 1, . . . , 1, 1 | conducting state |

FIG. 3 shows an embodiment of the switch arrangement according to the first aspect and an embodiment of the switch arrangement according to the ninth aspect.

Thus, the above description with respect to the switch arrangement of the first aspect and the switch arrangement of the ninth aspect is correspondingly valid for the switch arrangement of FIG. 3.

The switch arrangement of FIG. 3 corresponds to the switch arrangement of FIG. 2, wherein the even integer number of switches SL1, SR1 of the first series connection SC1 of the switch arrangement of FIG. 3 equals to two.

The switch arrangements of FIG. 4 correspond to the switch arrangement of FIG. 2, wherein the even integer number of switches $S_{L2}$, $S_{L1}$, $S_{R1}$, $S_{R2}$ of the first series connection SC1 of the switch arrangement of FIG. 4 (a) equals to four and the even integer number of switches $S_{L3}$, $S_{L2}$, $S_{L1}$, $S_{R1}$, $S_{R2}$, $S_{R3}$ of the first series connection SC1 of the switch arrangement of FIG. 4 (b) equals to six. Therefore, the above description of the switch arrangement of FIG. 2 is correspondingly valid for the switch arrangements of FIG. 4 and for describing the switch arrangements of FIG. 4 reference is made to the above description of FIG. 2.

Figure 5:
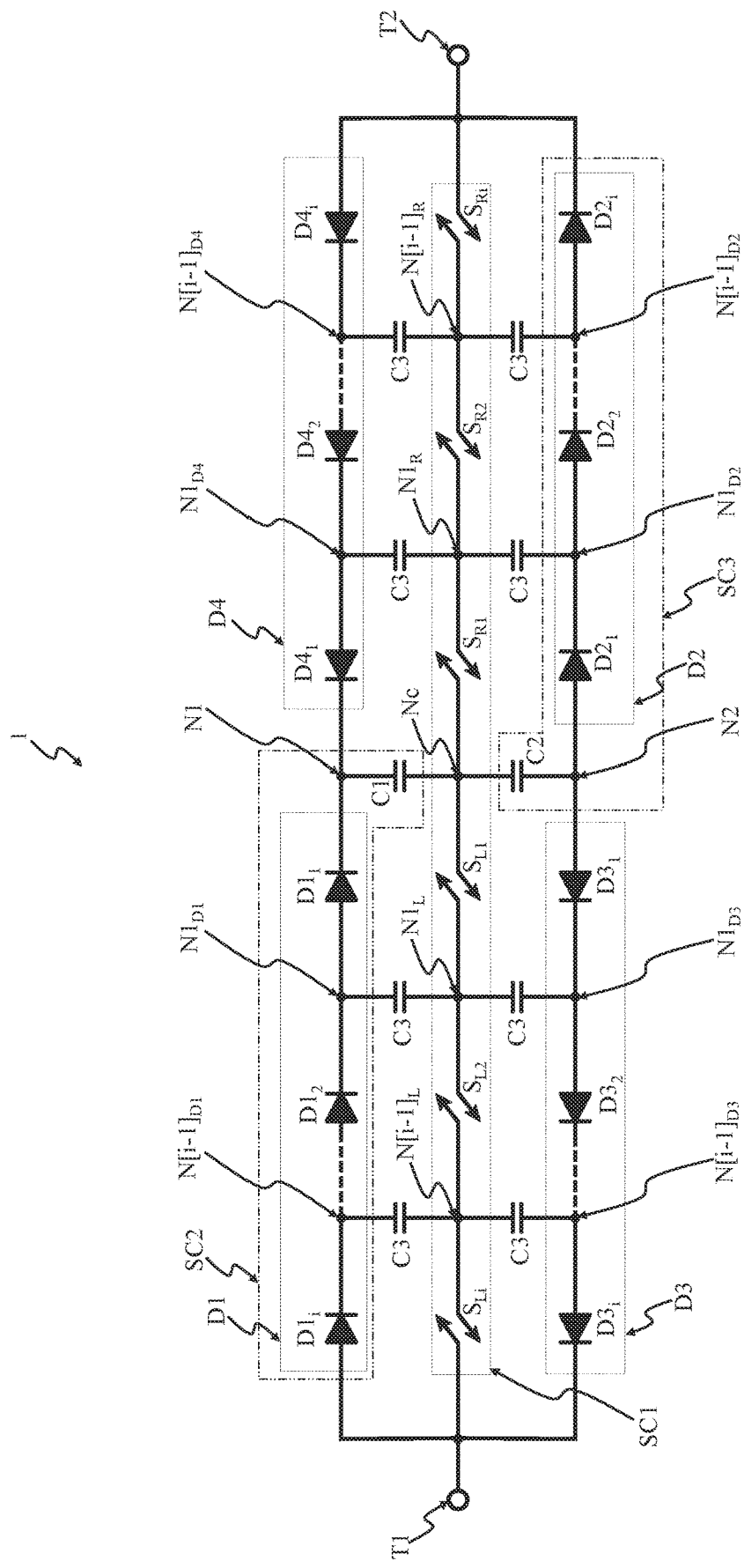

FIG. 5 shows an embodiment of the switch arrangement according to the first aspect and an embodiment of the switch arrangement according to the eighth aspect.

Thus, the above description with respect to the switch arrangement of the first aspect and the switch arrangement of the eighth aspect is correspondingly valid for the switch arrangement of FIG. 5.

The switch arrangement of FIG. 5 corresponds to the switch arrangement of FIG. 2, wherein the switches SL$i$, . . . , SL2, SL1, SR1, SR2, . . . , SR$i$ of the first series connection SC1 are bidirectional semiconductor switches. The switch arrangement 1 shown in FIG. 5 corresponds to a bidirectional semiconductor switch, which may also be called nested bidirectional switch. The above description of the switch arrangement of FIG. 2 is correspondingly valid for the switch arrangement of FIG. 5 and for describing the switch arrangement of FIG. 5 mainly reference is made to the above description of FIG. 2. In the following additional information with regard to the embodiment of FIG. 5 is provided.

Figure 6:
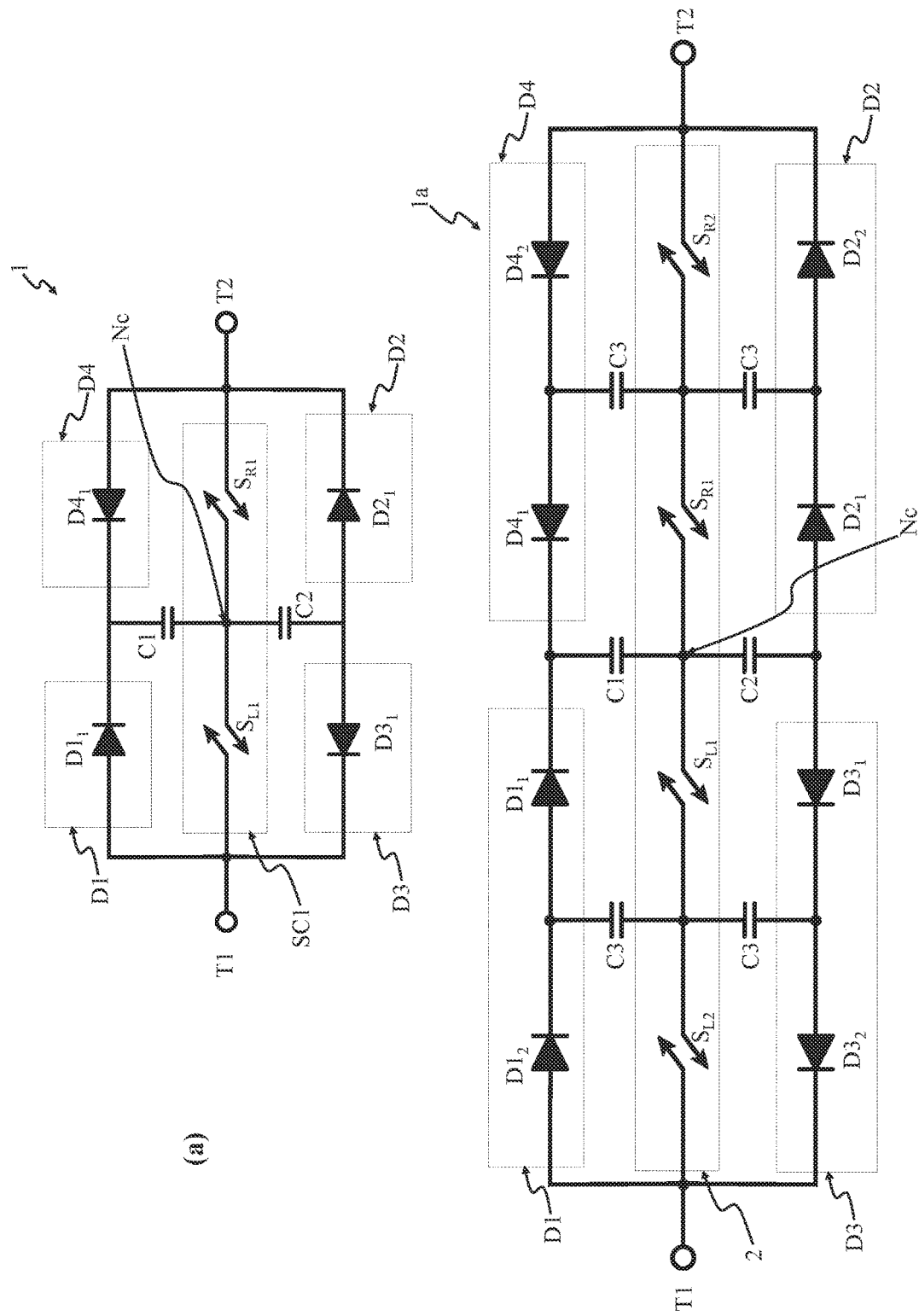
Figure 7:
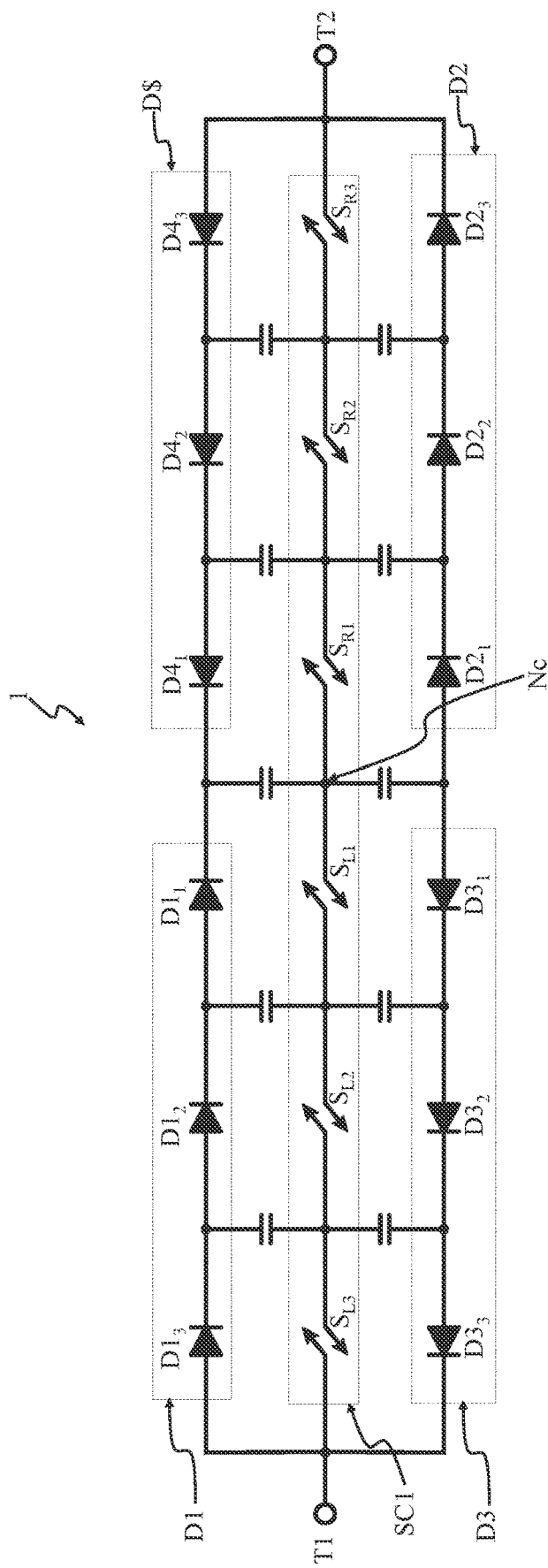

The even integer number of switches of the first series connection SC1 of the switch arrangement 1 of FIG. 5 may be equal to two (this case is shown in FIG. 6(*a*)), four (this case is shown in FIG. 6 (*b*)), six (this case is shown in FIG. 7) or to an even integer number greater than the aforementioned numbers.

The switch arrangement 1 of FIG. 5 comprises a third diode circuit D3 that is electrically connected between the first terminal T1 and the node N2 between the second capacitor C2 and the second diode circuit D2. The third diode circuit D3 comprises a number (i) of diodes equaling to half of the even integer number (2*i) of the switches SL$i$, . . . , SL2, SL1, SR1, SR2, . . . , SR$i$ of the first series connection SC1. That is the third diode circuit D3 comprises at least one diode.

In case the third diode circuit D3 comprises two or more diodes, the diodes are electrically connected in series to each other. As shown in FIG. 5, the diodes D3$i$, . . . , D32, D31 of the third diode circuit D3 are electrically connected in series to each other such that the anode of each of the diodes D3$i$, . . . , D32, D31 is directed towards the center node Nc of the first switching circuit SC1 and, thus, towards the second capacitor C2. In other words, the diodes D3$i$, . . . , D32, D31 of the third diode circuit D3 are electrically connected such that the anode of a diode of the third diode circuit D3 is electrically connected to the cathode of another diode (as it is the case for the diodes D3$i$ and D32) or to the second capacitor C2 (as it is the case for the Diode D31). Therefore, the diodes D3$i$, . . . , D32, D31 of the third diode circuit D3 allow a unidirectional current flow of a charging current from the center node Nc of the first series connection SC1 to the first terminal T1 for charging the first and second capacitor C1, C2, when the switches SL$i$, . . . , SL2, SL1, SR1, SR2, . . . , SR$i$ of the first series connection SC1 are in the non-conducting state. As shown in FIG. 5, the diodes D3$i$, . . . , D32, D31 of the third diode circuit D3 are arranged in antiparallel to the diodes D1$i$, . . . , D12, D11 of the first diode circuit D1.

The switch arrangement 1 of FIG. 5 comprises a fourth diode circuit D4 that is electrically connected between the second terminal T2 and the node N1 between the first capacitor C1 and the first diode circuit D1. The fourth diode circuit D4 also comprises a number (i) of diodes equaling to half of the even integer number (2*i) of the switches SL$i$, . . . , SL2, SL1, SR1, SR2, . . . , SR$i$ of the first series connection SC1. That is the fourth diode circuit D4 comprises at least one diode.

In case the fourth diode circuit D4 comprises two or more diodes, the diodes are electrically connected in series to each other. As shown in FIG. 5, the diodes D41, D42, . . . , D4$i$ of the fourth diode circuit D4 are electrically connected in series to each other such that the cathode of each of the diodes D41, D42, . . . , D4$i$ is directed towards the center node Nc of the first switching circuit SC1 and, thus, towards the first capacitor C1. In other words, the diodes D41, D42, . . . , D4$i$ of the fourth diode circuit D4 are electrically connected such that the cathode of a diode of the fourth diode circuit D4 is electrically connected to the anode of another diode (as it is the case for the diodes D4$i$ and D42) or to the first capacitor C1 (as it is the case for the Diode D41). Therefore, the diodes D41, D42, . . . , D4$i$ of the fourth diode circuit D4 allow a unidirectional current flow of a charging current from the second terminal T2 to the center node Nc of the first series connection SC1 for charging the first and second capacitor C1, C2, when the switches SL$i$, . . . , SL2, SL1, SR1, SR2, . . . , SR$i$ of the first series connection SC1 are in the non-conducting state. As shown in FIG. 5, the diodes D41, D42, . . . , D4$i$ of the fourth diode circuit D4 are arranged in antiparallel to the diodes D21, D22, . . . , D2$i$ of the second diode circuit D2.

As shown in FIG. 5, the switch arrangement 1 may further comprise for each node N[$i$−1]D3, . . . , N1D3, N1D4, . . . , N[$i$−1]D4 between two diodes of the third diode circuit D3 and the fourth diode circuit D4 an optional third capacitor C3. Each node (e.g. node N1D3) between two diodes of the third diode circuit D3 is electrically connected via the respective third capacitor C3 to a node (e.g. N1L) between two switches of the first part P1 of the first series connection SC1 between the first terminal T1 and the center node Nc of the first series connection SC1 such that the respective node (e.g. node N1D3) between two diodes is arranged in the series connection of the diodes D3$i$, . . . , D32, D31 of the third diode circuit D3 at the same position as the position of the node (e.g. node N1L) between two switches in the first part P1 of the first series connection SC1, to which the respective node (e.g. node N1D3) between two diodes is electrically connected to.

Each node (e.g. node N1D4) between two diodes of the fourth diode circuit D4 is electrically connected via the respective third capacitor C3 to a node (e.g. node N1R) between two switches of the second part P2 of the first series connection SC1 between the center node Nc of the first series connection SC1 and the second terminal T2, such that the respective node (e.g. node N1D4) between two diodes is arranged in the series connection of the diodes D41, D42, . . . , D4$i$ of the fourth diode circuit D4 at the same position as the position of the node (e.g. node N1R) between two switches in the second part P2 of the first series connection SC1, to which the respective node (e.g. node N1D4) between two diodes is electrically connected to.

In the light of the above, the number of switches, diodes and third capacitors C3 shown in FIG. 5 is only by way of example and does not limit the present disclosure.

FIGS. 6 and 7 show embodiments of the switch arrangement according to the first aspect and embodiments of the switch arrangement according to the eighth aspect.

Thus, the above description with respect to the switch arrangement of the first aspect and the switch arrangement of the eighth aspect is correspondingly valid for the switch arrangements of FIGS. 6 and 7.

The switch arrangements of FIGS. 6 and 7 correspond to the switch arrangement of FIG. 5, wherein the even integer number of switches $S_{L1}$, $S_{R1}$ of the first series connection SC1 of the switch arrangement of FIG. 6 (*a*) equals to two and the even integer number of switches $S_{L2}$, $S_{L1}$, $S_{R1}$, $S_{R2}$ of the first series connection SC1 of the switch arrangement of FIG. 6 (b) equals to four. The even integer number of switches $S_{L3}$, $S_{L2}$, $S_{L1}$, $S_{R1}$, $S_{R2}$, $S_{R3}$ of the first series connection SC1 of the switch arrangement of FIG. 7 equals to six. Therefore, the above description of the switch arrangement of FIG. 5 is correspondingly valid for the switch arrangements of FIGS. 6 and 7 and for describing the switch arrangements of FIGS. 6 and 7 reference is made to the above description of FIGS. 2 and 5.

Figure 8:
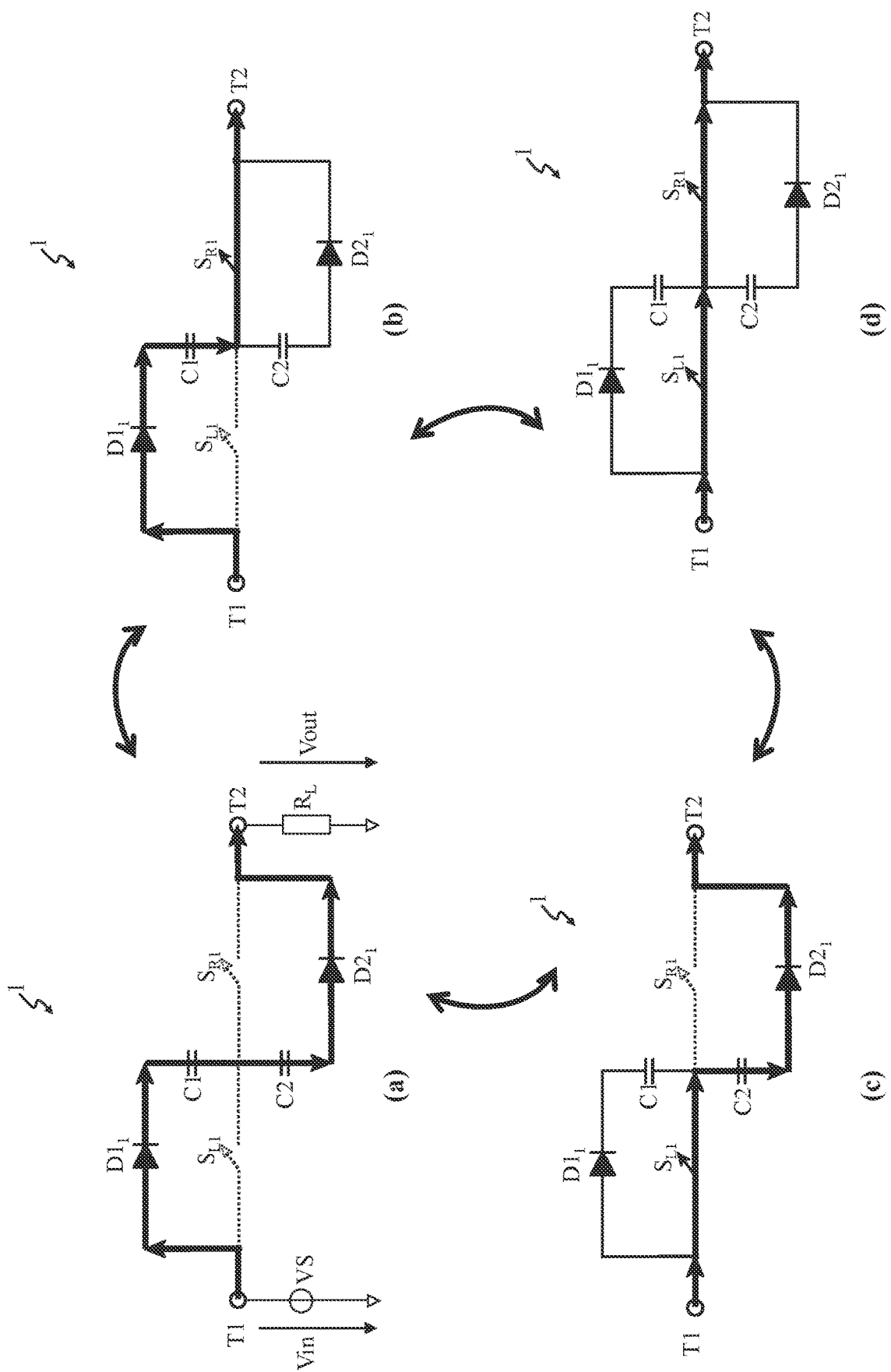
FIG. 8 shows switching states when switching the switch arrangement of FIG. 3 between the conducting state and the non-conducting state according to an example of the invention.

FIG. 8 shows switching states when switching the switch arrangement of FIG. 3 between the conducting state and the non-conducting state according to an embodiment of the invention.

Figure 9:
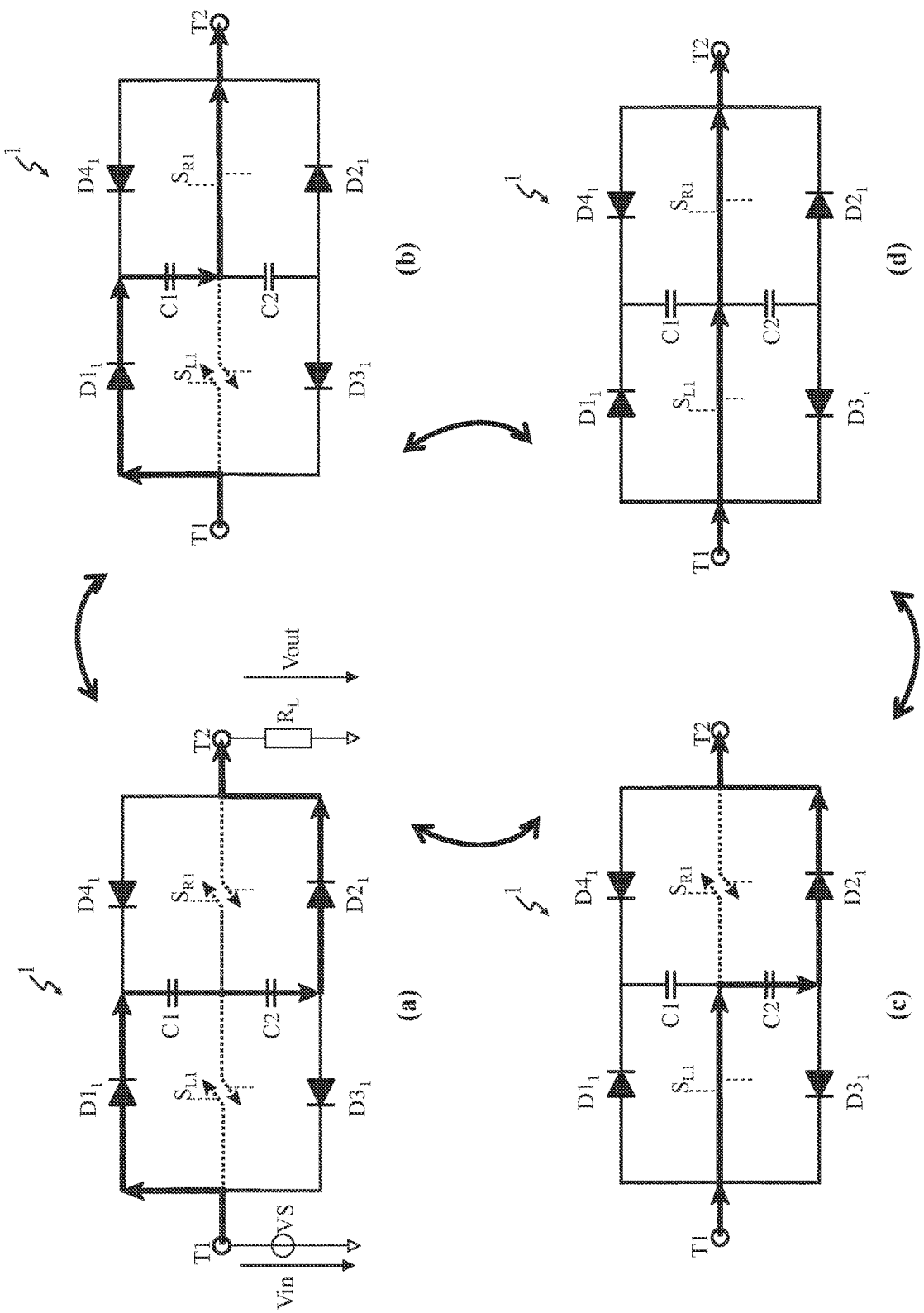
FIGS. 9 and 10 each show switching states when switching the switch arrangement of FIG. 6 (a) between the conducting state and the non-conducting state according to an example of the invention.
Figure 10:
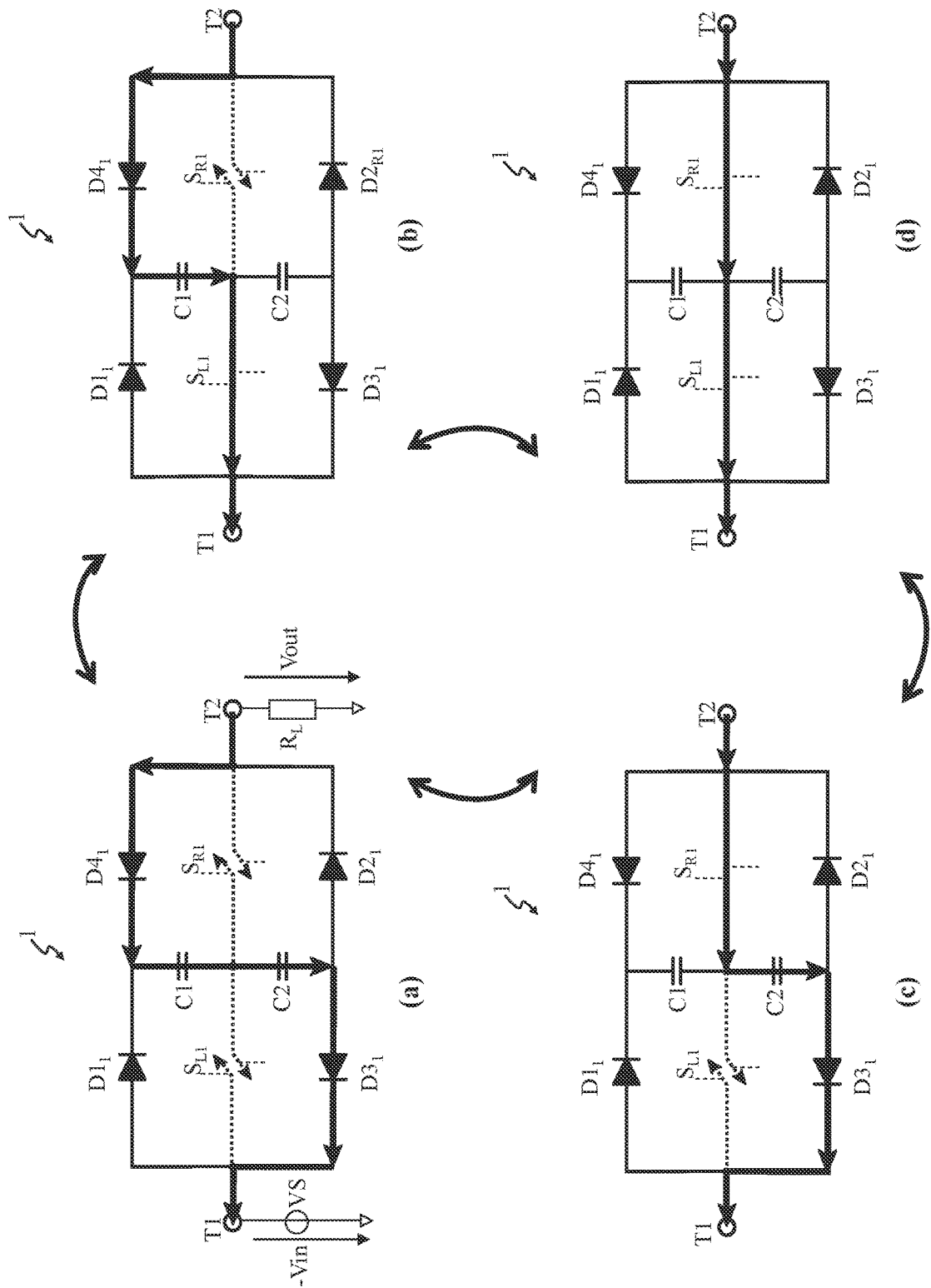

In FIGS. 8, 9 and 10 switches that are in the non-conducting state are shown by stripped lines. Furthermore, in FIGS. 8, 9 and 10 a current flow through the switch arrangement is shown by bolt arrows.

For describing the function of the switch arrangement 1 of FIG. 8, it is assumed that a voltage source VS providing a positive voltage Vin is connected to the first terminal T1 of the switch arrangement 1 and a load RL (exemplarily represented by a load resistance RL) is connected to the second terminal T2, as indicated in FIG. 8 (a). This is only by way of example for describing the function of the switch arrangement 1 of FIG. 8 and does not limit the present disclosure. The positive voltage Vin may be for example 1000 Volts (e.g. Vin=1000 V). In other words, it is assumed that the switch arrangement 1 is used for applying the positive voltage Vin of a voltage source VS to a load RL (in the conducting state of the switch arrangement 1, wherein Vout=Vin) and for interrupting the application of the positive voltage Vin of the voltage source VS to the load RL (in the non-conducting state of the switch arrangement 1, in which no current flows via the switch arrangement 1 through the load RL and, thus, Vout=0 V). The voltage at the second terminal T2 which corresponds to the voltage across the load RL may be referred to as the output voltage Vout of the switch arrangement 1.

In FIG. 8 (a) the switching arrangement is shown in the non-conducting state, i.e. the two switches SL1 and SR1 (of the first series connection SC1) of the switching arrangement 1 are in the non-conducting state. Therefore, no current (load current) flows from the first terminal T1 via the switches SL1 and SR1 to the second terminal T2. Thus, the switch arrangement 1 in the state shown in FIG. 8 (a) corresponds to a single semiconductor switch, in particular unidirectional switch, that is in the non-conducting state and, thus, does not provide a current path between its two terminals T1 and T2. Therefore, the positive voltage Vin of the voltage source VS is present across the first series connection of the switches SL1 and SR1 of the switch arrangement 1 (i.e. voltage between the two terminals T1 and T2 is equal to Vin).

As indicated in FIG. 8 (a), the diode D11 of the first diode circuit D1 and the diode D21 of the second diode circuit provide a current path for a charging current for charging the first capacitor C1 and second capacitor C2. Thus, when the two switches SL1 and SR1 are in the non-conducting state, current may flow via the diode D11 of the first diode circuit D1 and the diode D21 of the second diode circuit D2 ensuring that the capacitors C1 and C2 are charged to the voltage Vin. That is, the first capacitor C1 and the second capacitor C2 are each charged to half of the positive voltage Vin (VC1=VC2=Vin/2). Once the capacitors C1 and C2 are charged to the voltage Vin (VC1+VC2=Vin), the diode D11 of the first diode circuit D1 is reverse biased. That is, once the capacitors C1 and C2 are charged the current flow via the diodes D11, D21 of the first and second diode circuits D1, D2 stops. Since the capacitor C1 and C2 are each charged to half of the voltage Vin, the voltage of the switch SL1 and the voltage of the switch SRi each equal to half of the voltage Vin and, thus, voltage balancing is achieved by the capacitors C1 and C2. That is, the positive voltage Vin is equally distributed over the switches SL1 and SR1. The capacitors C1 and C2 are used for an intermediate voltage value of the output voltage Vout in the transient states (which are very short e.g. last several tens or hundreds of nanoseconds), between the voltage values of the output voltage in the non-conducting state and conducting-state.

For switching the switching arrangement 1 from the non-conducting to the conducting state, which is shown in FIG. 8 (d), the switches SL1 and SR1 of the switch arrangement 1 are switched after each other from the non-conducting state to the conducting state. Either the switch SL1 connected to the first terminal T1 or the switch SRi connected to the second terminal T2 may be switched at first. In case of more than two switches the switches may be switched successively one after the other, according to the order in the first series connection of the switches. That is, for switching the switch arrangement 1 according to FIGS. 3 and 8 from the non-conducting state to the conducting state, the switch arrangement 1 operates in one of the transient states, shown in FIG. 8 (b) and (c), in which only one of the switches SL1 and SR1 is switched to the conducting state (respectively turned on).

In case of the transient state shown in FIG. 8 (b), a current flows from the first terminal T1 via the first capacitor C1 and the conducting switch SR1 to the second terminal T2. When the conducting switch SRi is in the conducting state it corresponds to a short circuit and, thus, the voltage of the switch SRi is equal to 0 Volts. As a result, the second capacitor C2 is discharged and the output voltage Vout equals to half of the positive voltage Vin (Vout=Vin/2). In case of the transient state shown in FIG. 8 (c), a current flows from the first terminal T1 via the conducting switch SL1 and the second capacitor C2 to the second terminal T2. When the conducting switch SL1 is in the conducting state it corresponds to a short circuit and, thus, the voltage of the switch SL1 is equal to 0 Volts. As a result, the first capacitor C1 is discharged and the output voltage Vout equals to half of the voltage Vin (Vout=Vin/2).

For getting to the conducting state of the switch arrangement, shown in FIG. 8 (d), the respective other switch is switched from the non-conducting state to the conducting state. That is, for getting from the transient state shown in FIG. 8 (b) to the conducting state of the switch arrangement 1, the switch SL1 is switched to the conducting state. Accordingly, for getting from the transient state shown in FIG. 8 (c) to the conducting state of the switch arrangement 1, the switch SR1 is switched to the conducting state. In the conducting state all the switches SL1, SR1 of the switch arrangement 1 are in the conducting state and, thus, the voltage of each switch SL1 and SR1 is 0 Volts and the output voltage Vout of the switch arrangement 1 equals to the positive voltage Vin of the voltage source VS (Vout=Vin).

For switching the switch from the conducting state to the non-conducting state the switches SL1 and SR1 of the switch arrangement 1 are also switched after each other from the conducting state to the non-conducting state. Either the switch SL1 connected to the first terminal T1 or the switch SR1 connected to the second terminal T2 may be switched at first. In case of more than two switches the switches may be switched successively one after the other, according to the order in the first series connection of the switches. That is, for switching the switch arrangement 1 according to FIGS. 3 and 8 from the conducting state to the non-conducting state, the switch arrangement 1 operates in one of the transient states, shown in FIGS. 8 (*b*) and (*c*), in which only one of the switches SL1 and SR1 is switched to the non-conducting state (respectively turned off).

When, for switching the switch arrangement from the conducting state to the non-conducting state, at first the switch SL1 is switched from the conducting state to the non-conducting state (shown in FIG. 8 (*b*)), current flows from the first terminal T1 via the first capacitor C1 and the still conducting switch SR1 to the second terminal T2. As a result, the first capacitor C1 is charged to half of the voltage Vin (VC1=Vin/2), the voltage of the non-conducting switch SL1 is equal to half of the voltage Vin and the output voltage Vout is reduced to half of the voltage Vin (Vout=Vin/2). When, for switching the switch arrangement from the conducting state to the non-conducting state, at first the switch SR1 is switched from the conducting state to the non-conducting state (shown in FIG. 8 (*c*)), current flows from the first terminal T1 via the still conducting switch SL1 and the second capacitor C2 to the second terminal T2. As a result, the second capacitor C2 is charged to half of the voltage Vin (VC2=Vin/2), the voltage of the non-conducting switch SR1 is equal to half of the voltage Vin and the output voltage Vout is reduced to half of the voltage Vin (Vout=Vin/2).

For getting to the nonconducting state of the switch arrangement, shown in FIG. 8 (*a*), the respective other switch is switched from the conducting state to the non-conducting state. That is, for getting from the transient state shown in FIG. 8 (*b*) to the non-conducting state of the switch arrangement 1, the switch SRi is switched to the non-conducting state. Accordingly, for getting from the transient state shown in FIG. 8 (*c*) to the non-conducting state of the switch arrangement 1, the switch SL1 is switched to the non-conducting state. In the non-conducting state all the switches SL1, SR1 of the switch arrangement 1 are in the non-conducting state and, thus, the first capacitor C1 and the second capacitor C2 each are charged to half of the voltage Vin of the voltage source VS (VC1=VC2=Vin/2). As a result, the voltage of each switch SL1 and SR1 is equal to half of the voltage Vin and the output voltage Vout of the switch arrangement 1 equals to 0 Volts (Vout=0V).

FIGS. 9 and 10 each show switching states when switching the switch arrangement of FIG. 6 (*a*) between the conducting state and the non-conducting state according to an embodiment of the invention.

FIG. 9 (*a*) shows the non-conducting state of the switch arrangement 1, FIGS. 9 (*b*) and (*c*) show the two possible transient states of the switch arrangement 1 and FIG. 9 (*d*) shows the conducting state of the switch arrangement 1, in case that in the conducting state current flows from the first terminal T1 via the bidirectional switches $S_{L1}$ and $S_{R1}$ to the second terminal T2 of the switch arrangement 1. Thus, it may be assumed that a voltage source VS providing a positive voltage Vin is connected to the first terminal T1 and a load $R_L$ is connected to the second terminal T2, as indicated in FIG. 9 (*a*). The positive voltage Vin may be for example 1000 Volts (e.g. Vin=1000 V). Therefore, in the non-conducting state, and the two possible transient states current may flow via the diodes $D1_1$, $D2_1$ of the first diode circuit D1 and second diode circuit D2. The above description of FIG. 8 is correspondingly valid for describing the four states of the switch arrangement 1 shown in FIG. 9.

FIG. 10 (*a*) shows the non-conducting state of the switch arrangement 1, FIG. 10 (*b*) and (*c*) show the two possible transient states of the switch arrangement 1 and FIG. 10 (*d*) shows the conducting state of the switch arrangement 1, in case that in the conducting state current flows from the second terminal T2 via the bidirectional switches SR1 and SL1 to the first terminal T1 of the switch arrangement 1. Thus, it may be assumed that a voltage source VS providing a negative voltage −Vin is connected to the first terminal T2 and a load RL is connected to the second terminal T1, as indicated in FIG. 10 (*a*). The negative voltage −Vin may be for example −1000 Volts (e.g. −Vin=−1000 V). This is equivalent to connecting a voltage source VS to the second terminal T2 of the switch arrangement 1, wherein the voltage source VS provides a positive voltage Vin. Therefore, in the non-conducting state, and the two possible transient states current may flow via the diodes D31, D41 of the third diode circuit D3 and fourth diode circuit D4. The above description of FIG. 8 is correspondingly valid for describing the four states of the switch arrangement 1 shown in FIG. 10.

Figure 11:
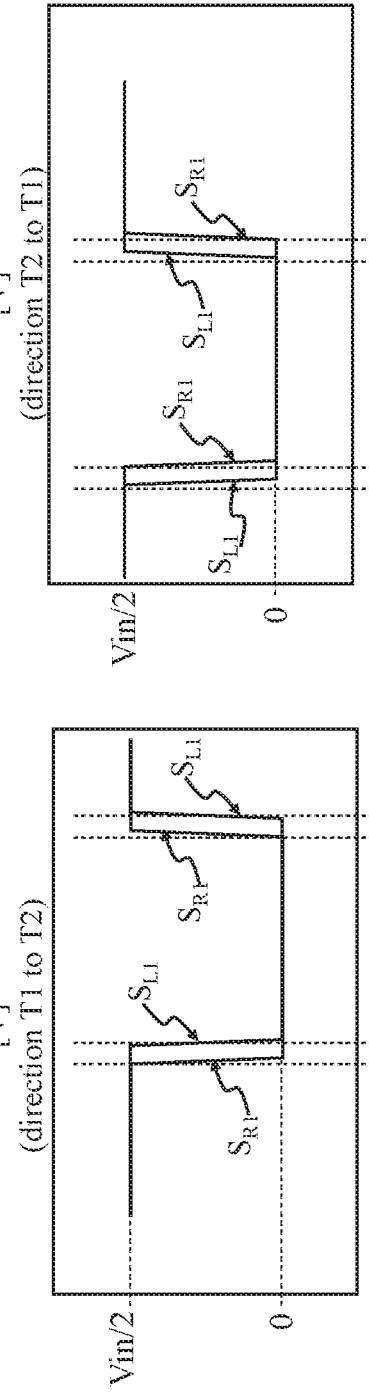
FIG. 11 shows voltage curves over time when switching the switch arrangement of FIGS. 6 (a), 9 and 10 between the conducting state and the non-conducting state according to an example of the invention.
Figure 11:
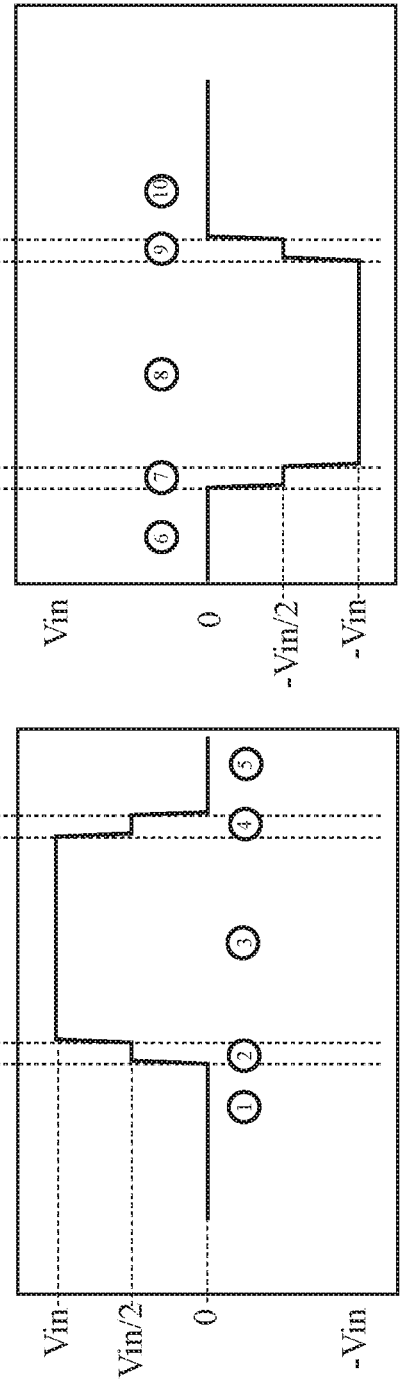

FIG. 11 shows voltage curves over time when switching the switch arrangement of FIG. 6 (*a*), 9 and 10 between the conducting state and the non-conducting state according to an embodiment of the invention.

The above description of FIG. 8 is correspondingly valid for describing the states (1) to (10) of the switch arrangement 1 shown in FIG. 11. With regard to the switch arrangement of FIG. 6 (*a*), the top graphs of FIG. 11 show the voltage of the switch $S_{L1}$ and the voltage of the switch $S_{R1}$ over time (the switches $S_{L1}$ and $S_{R1}$ of the switch arrangement of FIG. 6 (*a*) correspond to the switches $S_{L1}$ and $S_{R1}$ of the switch arrangement of FIG. 3). The passages "voltage of a switch" and "voltage across a switch" may be used as synonyms. That is, the top graphs of FIG. 11 show the voltage across the switches $S_{L1}$ and $S_{R1}$ over time. The bottom graphs of FIG. 11 show the respective output voltage Vout. The graphs of FIG. 11 (*a*) shows the case, when the switching arrangement of FIG. 6 (*a*) is used for providing, in the conducting state, a current path from the first terminal T1 via the switches $S_{L1}$ and $S_{R1}$ to the second terminal T2, as it is shown in FIG. 9. The graphs of FIG. 11 (*b*) show the case, when the switching arrangement of FIG. 6 (*a*) is used for providing, in the conducting state, a current path from the second terminal T2 via the switches $S_{R1}$ and $S_{L1}$ to the first terminal T1, as it is shown in FIG. 10.

The region (1) of FIG. 11 (*a*) corresponds to the non-conducting state (shown in FIG. 9 (*a*)), in which the voltage of the switches SL1 and SR1 equals to half of the voltage Vin and the output voltage Vout equals to 0 Volt (it may be assumed that a voltage source providing a positive voltage Vin is connected to the first terminal T1). That is, in region (1) the voltage Vin is equally shared between the switches SL1 and SR1 and there is no current flow via the switches SL1 and SR1 causing the output voltage to equal to 0 Volt (Vout=0 V). The voltage Vin may equal for example to 1000 Volts, which is only by way of example and does not limit the present disclosure. The region (2) of FIG. 11 (*a*) corresponds to the transient state of the switch arrangement when the switch SR1 is switched at first from the non-conducting state to the conducting state (shown in FIG. 9 (*b*)). Therefore, in the region (2), the voltage of the switch SR1 decreases to 0 Volt and the output voltage Vout increases to half of the voltage Vin (Vout=Vin/2). After a short delay the switch SL1 is switched to the conducting state and, thus, the voltage of the switch SL1 decreases to 0 Volt and the output voltage Vout increases to the full voltage Vin (Vout=Vin), as shown in region (3) of FIG. 11 (a). Therefore, the region (3) corresponds to the conduction state of the switch arrangement (shown in FIG. 9 (d)). Therefore, the regions (1) to (3) show the voltage of the switches SL1 and SR1 and the output voltage Vout, when the switching arrangement of FIG. 6 (a) is switched from the non-conducting state via the transient state shown in FIG. 9 (b) to the conducting state.

The region (4) of FIG. 11 (a) corresponds to the transient state of the switch arrangement when the switch SR1 is switched at first from the conducting state to the non-conducting state (shown in FIG. 9 (c)). Therefore, in the region (4), the voltage of the switch SR1 increases to half of the voltage Vin and the output voltage Vout decreases to half of the voltage Vin (Vout=Vin/2). After a short delay the switch $S_{L1}$ is switched to the non-conducting state and, thus, the voltage of the switch $S_{L1}$ increases to half of the voltage Vin and the output voltage Vout increases to 0 Volt (Vout=0 V), as shown in region (5) of FIG. 11 (a). Therefore, the region (5) corresponds again to the non-conduction state of the switch arrangement (shown in FIG. 9 (a)). Therefore, the regions (3) to (5) show the voltage of the switches $S_{L1}$ and $S_{R1}$ and the output voltage Vout, when the switching arrangement of FIG. 6 (a) is switched from the conducting state via the transient state shown in FIG. 9 (c) to the non-conducting state.

FIG. 11 (b) shows the same behavior of the switching arrangement of FIG. 6 (a) as shown in FIG. 11 (a) for the case of a voltage source VS providing a negative voltage −Vin is connected to the first terminal T1 of the switch arrangement. This is equivalent to connecting a voltage source VS to the second terminal T2 of the switch arrangement, wherein the voltage source VS provides a positive voltage Vin. The switching sequence of FIG. 11 (b) is different to the one of FIG. 11 (a) in that the switch arrangement is switched from the non-conducting state via the transient state shown in FIG. 9 (c) to the conducting state and from the conducting state via the transient state shown in FIG. 9 (b) to the non-conducting state.

Figure 12:
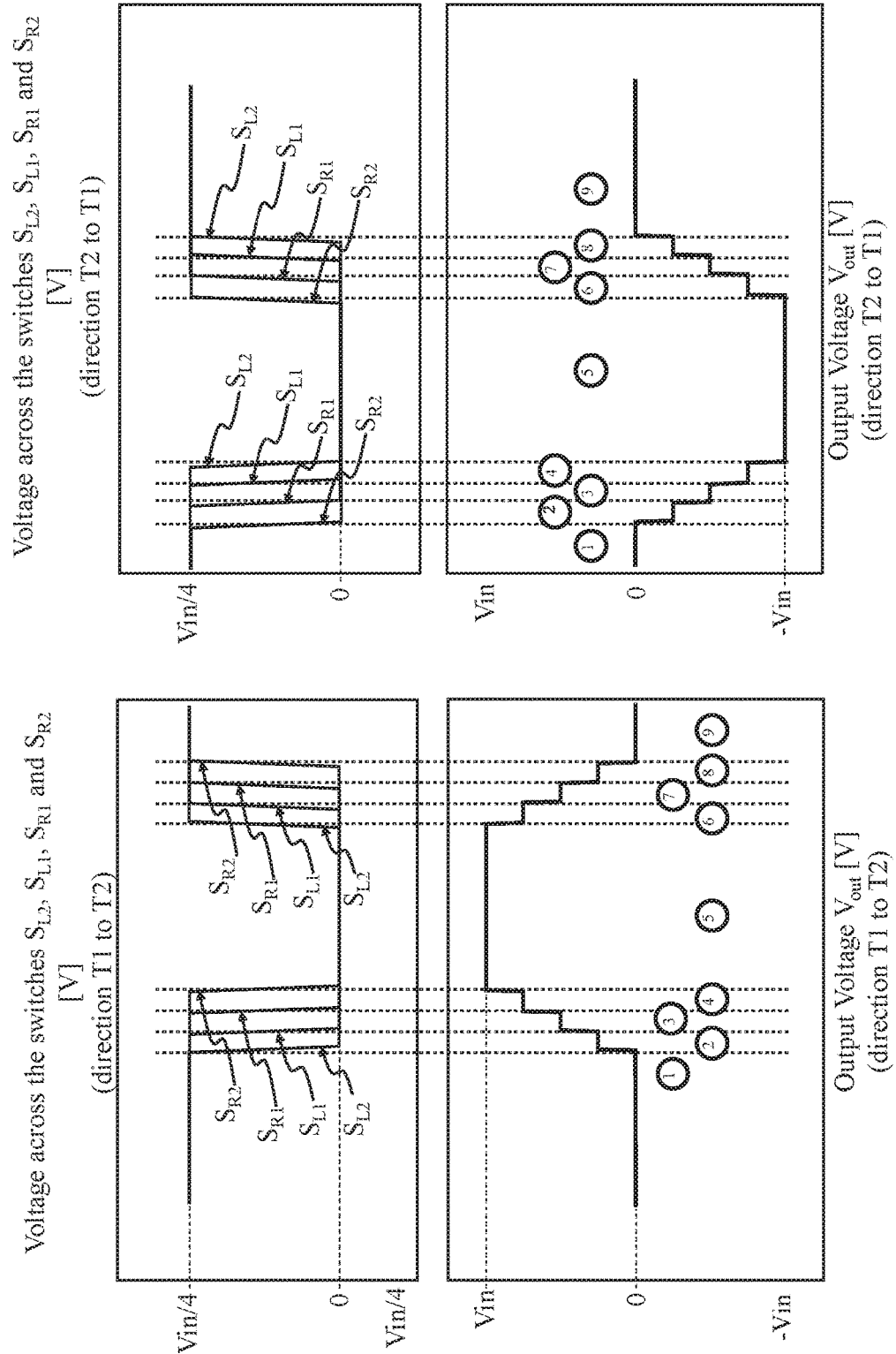
FIG. 12 shows voltage curves over time when switching the switch arrangement of FIG. 6 (b) between the conducting state and the non-conducting state according to an example of the invention.

FIG. 12 shows voltage curves over time when switching the switch arrangement of FIG. 6 (b) between the conducting state and the non-conducting state according to an embodiment of the invention.

The above description of FIGS. 8, 9, 10 and 11 is correspondingly valid for describing the states (1) to (9) of the switch arrangement 1 shown in FIGS. 12 (a) and (b). With regard to the switch arrangement of FIG. 6 (b), the top graphs of FIG. 12 show the voltages of the switches $S_{L2}$, $S_{L1}$, $S_{R1}$, $S_{R2}$ over time. The bottom graphs of FIG. 12 show the respective output voltage Vout. The graphs of FIG. 12 (a) show the case, when the switching arrangement of FIG. 6 (b) is used for providing, in the conducting state, a current path from the first terminal T1 via the switches $S_{L2}$, $S_{L1}$, $S_{R1}$, $S_{R2}$ to the second terminal T2, as it shown in FIG. 11 (a) for the switch arrangement of FIG. 6 (a). The graphs of FIG. 11 (b) show the case, when the switching arrangement of FIG. 6 (b) is used for providing, in the conducting state, a current path from the second terminal T2 via the switches $S_{R2}$, $S_{R1}$, $S_{L1}$, $S_{L2}$ to the first terminal T1, as it shown in FIG. 11 (b) for the switch arrangement of FIG. 6 (a).

The regions (1) and (9) of FIG. 12 (a) correspond to the non-conducting state of the switch arrangement of FIG. 6 (b) and, thus, correspond to the regions (1) and (5) of FIG. 11 (a). The region (5) of FIG. 12 (a) corresponds to the conducting state of the switch arrangement of FIG. 6 (b) and, thus, correspond to the region (3) of FIG. 11 (a).

The regions (2), (3) and (4) of FIG. 12 (a) correspond to transient states of the switch arrangement of FIG. 6 (b), when switching the switch arrangement from the non-conducting state to the conducting state. According to the regions (1) to (5) of FIG. 12 (a), for switching the switch arrangement of FIG. 6 (b) from the non-conducting state to the conducting state, the switches SL2, SL1, SR1, SR2 are switched successively one after the other, according to the order in the series connection of the switches SL2, SL1, SR1, SR2 from the non-conducting state to the conducting state (with a short delay in between of e.g. several tens or hundreds of nano-seconds), wherein at first the switch SL2 connected to the first terminal T1 of the switch arrangement is switched from the non-conducting state to the conducting state (region (2) of FIG. 12 (a)). Thus, in region (3) of FIG. 12 (a) the switch SL1 (which is the successive switch to the switch SL2 in the series connection of the switches) is switched to the conducting state, in region (4) of FIG. 12 (a) the switch SR1 (which is the successive switch to the switch SL1 in the series connection of the switches) is switched to the conducting state and in the region (5) of FIG. 12 (a) the switch SR2 (which is the successive switch to the switch SR1 in the series connection of the switches) is switched to the conducting state.

The regions (6), (7) and (8) of FIG. 12 (a) correspond to transient states of the switch arrangement of FIG. 6 (b), when switching the switch arrangement from the conducting state to the non-conducting state. According to the regions (5) to (9) of FIG. 12 (a), for switching the switch arrangement of FIG. 6 (b) from the conducting state to the non-conducting state, the switches SL2, SL1, SR1, SR2 are switched successively one after the other, according to the order in the series connection of the switches SL2, SL1, SR1, SR2 from the conducting state to the non-conducting state (with a short delay in between of e.g. several tens or hundreds of nano-seconds), wherein at first the switch SL2 connected to the first terminal T1 of the switch arrangement is switched from the conducting state to the non-conducting state (region (6) of FIG. 12 (a)). Thus, in region (7) of FIG. 12 (a) the switch SL1 (which is the successive switch to the switch SL2 in the series connection of the switches) is switched to the non-conducting state, in region (8) of FIG. 12 (a) the switch SR1 (which is the successive switch to the switch SL1 in the series connection of the switches) is switched to the non-conducting state and in the region (9) of FIG. 12 (a) the switch SR2 (which is the successive switch to the switch SR1 in the series connection of the switches) is switched to the non-conducting state.

FIG. 12 (b) shows the same behavior of the switching arrangement of FIG. 6 (b) as shown in FIG. 12 (a) for the case of a voltage source VS providing a negative voltage −Vin is connected to the first terminal T1 of the switch arrangement. This is equivalent to connecting a voltage source VS to the second terminal T2 of the switch arrangement, wherein the voltage source VS provides a positive voltage Vin. The switching sequence of FIG. 12 (b) is different to the one of FIG. 12 (a) in that for switching the switch arrangement from the non-conducting state to the conducting state (region (1) to (5) of FIG. 12 (b)) and from the conducting state to the non-conducting state (regions (5) to (9) of FIG. 12 (b)), the switching is started with the switch SR2 connected to the second terminal T2 and then continued according to the order of the switches in the series connection of the switches.

As shown in FIGS. 11 and 12, the number of transient states between the conducting state and non-conducting state is one less than the number of switches of the switch arrangement. Thus, the number of intermediate voltage values of the output voltage Vout between the voltage value of the output voltage Vout at the non-conducting state (Vout=0 V) and the voltage value of the output voltage Vout at the conducting state (Vout=Vin or −Vin) is one less than the number of switches of the switch arrangement.

FIGS. 13 to 16 show converter systems and converters according to embodiments of the present invention.

Figure 13:
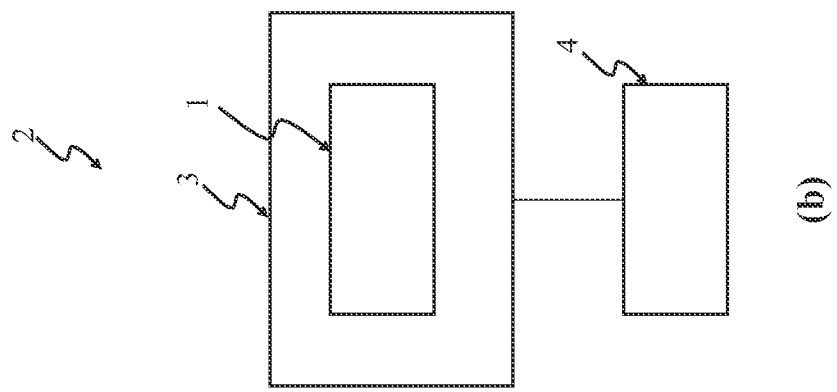
FIGS. 13 to 16 show converter systems and converters according to example of the present invention.
Figure 13:
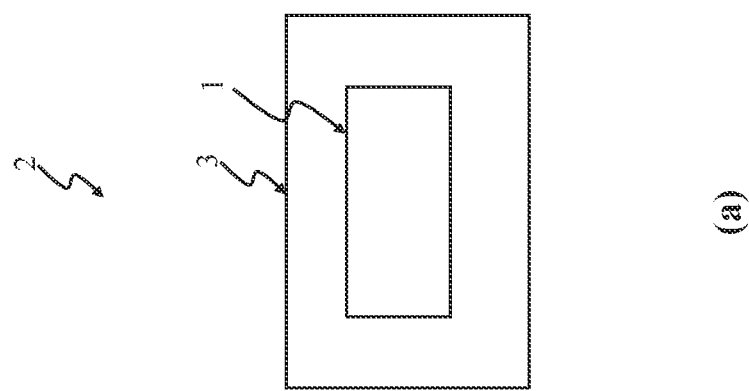

FIG. 13 shows embodiments of the converter system according to the third aspect. Thus, the above description with respect to converter system of the third aspect is correspondingly valid for the converter systems of FIG. 13.

As shown in FIG. 13 (a), a converter system 2 according to an embodiment of the disclosure comprises a converter 3. The converter 3 may be an AC/DC converter, a DC/AC converter, a DC/DC converter or an AC/AC converter. In particular, the converter 3 may be a T-Type converter, e.g. a 3-Level T-Type converter; a Nested T-Type converter, e.g. a 3-Level Nested T-Type converter or a 5-Level Nested T-Type converter; a Heric converter; a Vienna converter/rectifier; or a Matrix converter. The converter 3 may be implemented according to further power electronics converter topologies known by the skilled person. The converter 3 of the converter system may comprises one or more switch arrangements 1 for controlling power conversion by the converter 3.

The one or more switching arrangements 1 may correspond to one or more switch arrangements of the first aspect or any of its implementation forms, one or more switch arrangements of the eighth aspect or any of its implementation forms, one or more switch arrangements of the ninth aspect or any of its implementation forms and/or one or more switch arrangements of the tenth aspect or any of its implementation forms. Thus, the one or more switch arrangements 1 may correspond to any one of the switching arrangements shown in FIGS. 1 to 7. The converter system 2 may also comprise more than one converter 3. The aforementioned is correspondingly valid for a plurality of converters 3 of the converter system 2.

The converter system of FIG. 13 (b) corresponds to the converter system of FIG. 13 (a). Therefore, the above description with regard to the converter system of FIG. 13 (a) is also valid for the converter system of FIG. 13 (b). The converter system 2 of FIG. 13 (b) additionally comprises a control unit 4. The control unit 4 is configured to control power conversion by the at least one converter 3 by performing the method of the second aspect or any of its implementation forms for switching the one or more switch arrangements 1 of the at least one converter 3 between the conducting state and the non-conducting state. Thus, the control unit 4 may be configured to control switching of the one or more switching arrangements 1 of the at least one converter 3 as described above with respect to the FIGS. 1 to 12.

The control unit 4 may comprise or correspond to a processor, a microprocessor, a controller, a microcontroller, a field programmable gate array (FPGA), an application specific integrated circuit (ASIC) or any combination of them.

Figure 14:
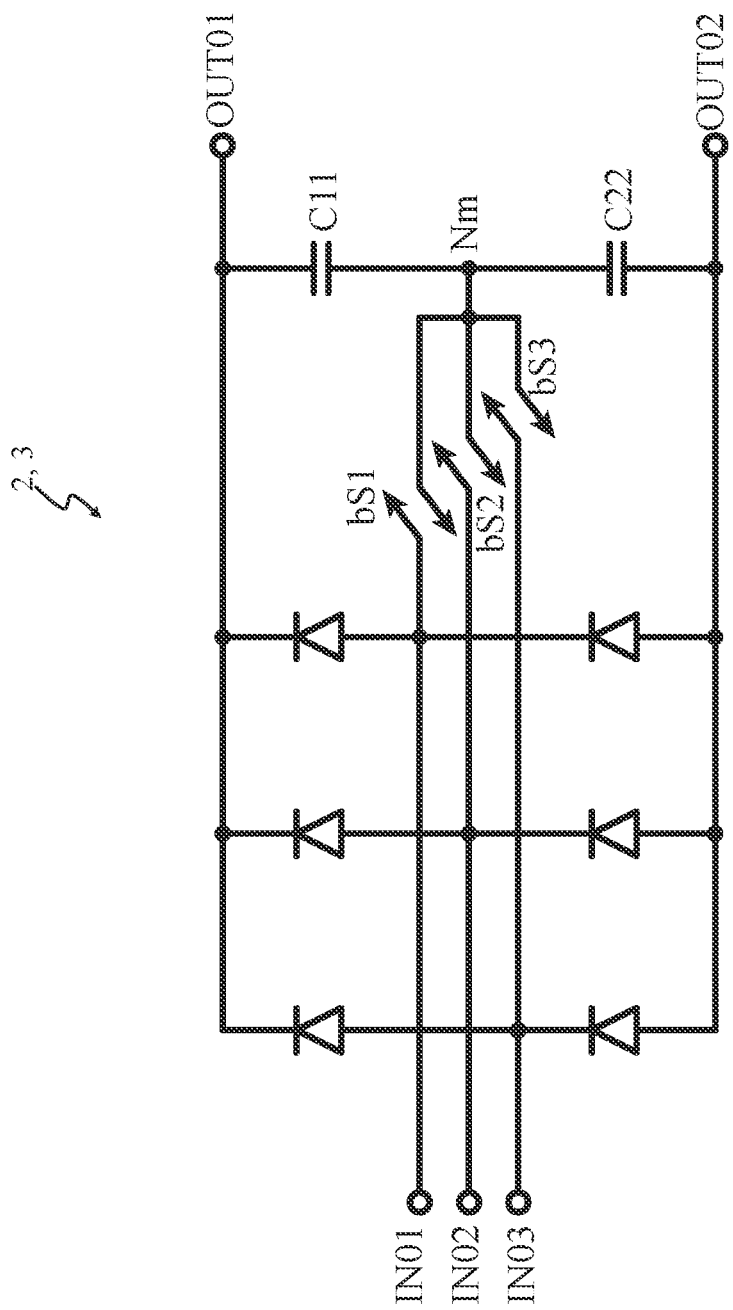
Figure 15:
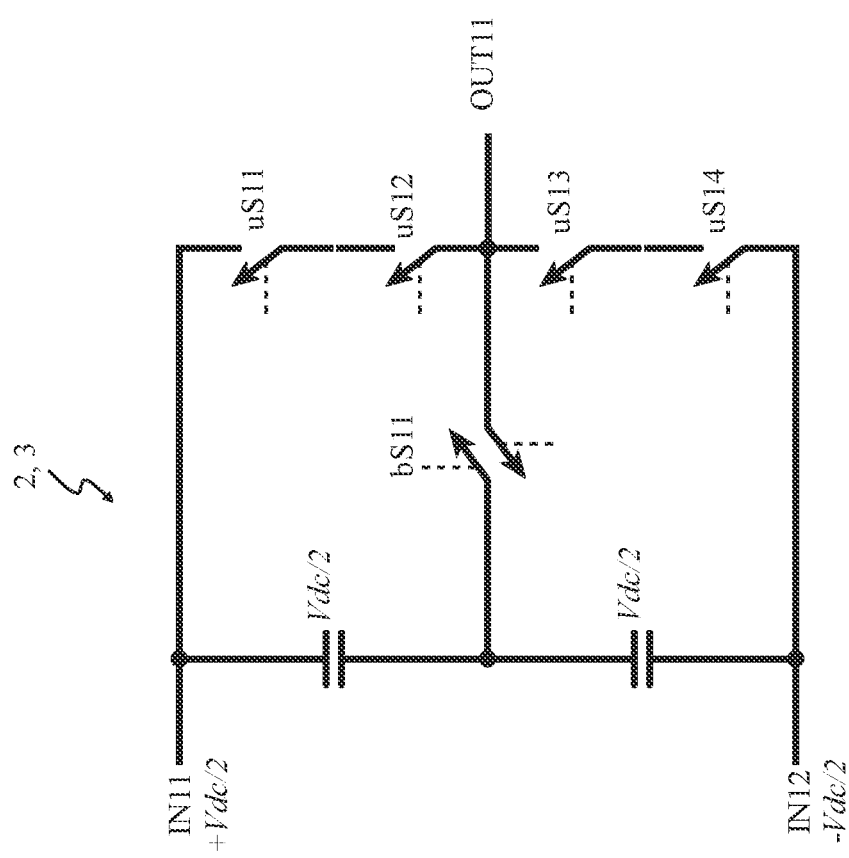
Figure 16:
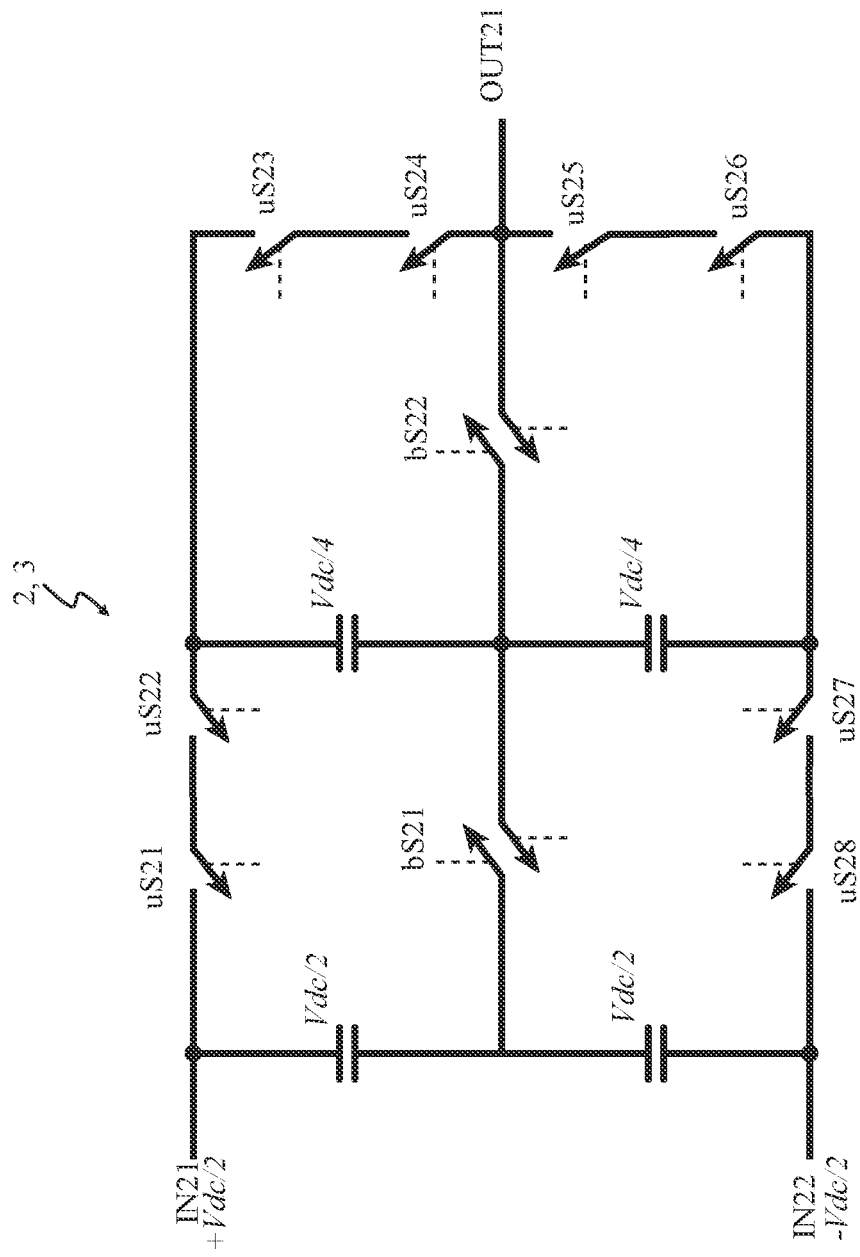

FIGS. 14 to 16 show embodiments of the at least one converter 3 of the converter systems of FIG. 13.

FIG. 14 shows a Vienna converter 3, wherein the bidirectional switches bS1, bS2 and bS3 each may correspond to the switch arrangement according to the first aspect or any of its implementation forms, wherein the switches of the switch arrangement are bidirectional switches. Alternatively, the bidirectional switches bS1, bS2 and bS3 each may correspond to a switch arrangement according to the eighth aspect or any of its implementation forms, wherein the switches of the switch arrangement are bidirectional switches. In particular, the bidirectional switches bS1, bS2 and bS3 each may be implemented by one of the switching arrangements according to FIGS. 5, 6 (a), 6 (b) and 7. At least one of the bidirectional switches bS1, bS2 and bS3 may be differently implemented compared to the other switches.

FIG. 15 shows a 3-Level Nested T-Type converter 3. The bidirectional switch bS11 of the 3-Level Nested T-Type converter 3 may be implemented as outlined above with respect to the bidirectional switches bS1, bS2 and bS3 of the Vienna converter 3 of FIG. 14. The unidirectional switches uS11, uS12, uS13 and uS14 may be implemented by single unidirectional switches, e.g. as shown in FIG. 1. Alternatively or additionally, at least one, in particular all, of the unidirectional switches uS11, uS12, uS13 and uS14 may each be implemented by the switch arrangement according to the first aspect or any of its implementation forms, wherein at least one of the switches of the switch arrangement is a unidirectional switch or the switches of the switch arrangement are unidirectional switches. Alternatively or additionally, at least one, in particular all, of the unidirectional switches uS11, uS12, uS13 and uS14 may each be implemented by a switch arrangement according to the eighth aspect or any of its implementation forms, according to the ninth aspect or any of its implementation forms or according to the tenth aspect or any of its implementation forms, wherein at least one of the switches of the switch arrangement is a unidirectional switch or the switches of the switch arrangement are unidirectional switches. In particular, the unidirectional switches uS11, uS12, uS13 and uS14 each may be implemented by one of the switching arrangements according to FIGS. 2, 3, 4 (a), and 4 (b). At least one of the unidirectional switches uS11, uS12, uS13 and uS14 may be differently implemented compared to the other switches.

FIG. 16 shows a 5-Level Nested T-Type converter 3. The bidirectional switches bS21 and bS22 of the 5-Level Nested T-Type converter 3 may be implemented as outlined above with respect to the bidirectional switches bS1, bS2 and bS3 of the Vienna converter 3 of FIG. 14. The unidirectional switches uS21, uS22, uS23, uS24, uS25, uS26, uS27 and uS28 may be implemented as outlined above with respect to the unidirectional switches uS11, uS12, uS13 and uS14 of the 3-Level Nested T-Type converter of FIG. 15.

The voltages indicated in FIGS. 15 and 16 are only by way of example and do not limit the present disclosure.

The disclosure has been described in conjunction with various embodiments as examples as well as implementations. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

The invention claimed is:

1. A switch arrangement for a converter, wherein the switch arrangement comprises:
 a first series connection (SC1) of at least two switch pairs between two terminals (T1, T2) of the switch arrangement, wherein the at least two switch pairs each comprise semiconductor switches;

a second series connection (SC2) of a first capacitor (C1) and a first diode circuit (D1) electrically connected in parallel to a first part (P1) of the first series connection (SC1) between a first terminal (T1) of the two terminals (T1, T2) and a node (Nc) between the at least two switch pairs, wherein the first diode circuit (D1) comprises at least one diode ($D1_1$); and a third series connection (SC3) of a second capacitor (C2) and a second diode circuit (D2) electrically connected in parallel to a second part (P2) of the first series connection (SC1) between a second terminal (T2) of the two terminals (T1, T2) and the node (Nc) between the at least two switch pairs, wherein the second diode circuit (D2) comprises at least one diode ($D2_1$), wherein the switch arrangement is configured to provide a quasi-multilevel operation that switches the at least two switch pairs between a non-conducting state and a conducting state via at least one intermediate transient state that switches a first of at least two switch pairs before a second of the at least two switch pairs to thereby increase effective voltage capability of the at least two switch pairs between the two terminals (T1, T2) of the switch arrangement.

2. The switch arrangement according to claim 1, wherein the first series connection (SC1) comprises an even integer number of switches ($S_{Li}$, $S_{L2}$, $S_{L1}$, $S_{R1}$, $S_{R2}$, $S_{Ri}$) greater or equal to four, wherein the switches ($S_{Li}$, $S_{L2}$, $S_{L1}$, $S_{R1}$, $S_{R2}$, $S_{Ri}$) are semiconductor switches;

the second series connection (SC2) and third series connection (SC3) are each electrically connected to a node (Nc) at the center of the first series connection (SC1), which is a center node (Nc) of the first series connection (SC1);

the first capacitor (C1) of the second series connection (SC2) and the second capacitor (C2) of the third series connection (SC3) are electrically connected to the center node (Nc) of the first series connection (SC1);

the first diode circuit (D1) and the second diode circuit (D2) each comprise a number of diodes equaling to half of the even integer number of the switches ($S_{Li}$, $S_{L2}$, $S_{L1}$, $S_{R1}$, $S_{R2}$, $S_{Ri}$); and the diodes ($D1_1$, $D1_2$, $D1_i$; $D2_1$, $D2_2$, $D2_i$) of each of the first diode circuit (D1) and the second diode circuit (D2) are electrically connected in series to each other.

3. The switch arrangement according to claim 1, wherein the switch arrangement comprises a third diode circuit (D3) and a fourth diode circuit (D4) each comprising at least one diode ($D3_1$; $D4_1$);

the first capacitor (C1) of the second series connection (SC2) and the second capacitor (C2) of the third series connection (SC3) are electrically connected to the node (Nc) between the two switches;

the third diode circuit (D3) is electrically connected between the first terminal (T1) and a node (N2) between the second capacitor (C2) and the second diode circuit (D2);

the fourth diode circuit (D4) is electrically connected between the second terminal (T2) and a node (N1) between the first capacitor (C1) and the first diode circuit (D1);

the at least one diode ($D3_1$) of the third diode circuit (D3) is arranged in antiparallel to the at least one diode ($D1_1$) of the first diode circuit (D1); and the at least one diode ($D4_1$) of the fourth diode circuit (D4) is arranged in antiparallel to the at least one diode ($D2_1$) of the second diode circuit (D2).

4. The switch arrangement according to claim 3, wherein the first series connection (SC1) comprises an even integer number of switches ($S_{Li}$, $S_{L2}$, $S_{L1}$, $S_{R1}$, $S_{R2}$, $S_{Ri}$) greater or equal to four, wherein the switches ($S_{Li}$, $S_{L2}$, $S_{L1}$, $S_{R1}$, $S_{R2}$, $S_{Ri}$) are semiconductor switches;

the second series connection (SC2) and third series connection (SC3) are each electrically connected to a node (Nc) at the center of the first series connection (SC1), which is a center node (Nc) of the first series connection (SC1);

the first capacitor (C1) of the second series connection (SC2) and the second capacitor (C2) of the third series connection (SC3) are electrically connected to the center node (Nc) of the first series connection (SC1);

the first diode circuit (D1), the second diode circuit (D2), the third diode circuit (D3) and the fourth diode circuit (D4) each comprise a number of diodes equaling to half of the even integer number of the switches ($S_{Li}$, $S_{L2}$, $S_{L1}$, $S_{R1}$, $S_{R2}$, $S_{Ri}$); and the diodes ($D1_1$, $D1_2$, $D1_i$; $D2_1$, $D2_2$, $D2_i$; $D3_1$, $D3_2$, $D3_i$; $D4_1$, $D4_2$, $D4_i$) of each of the first diode circuit (D1), the second diode circuit (D2), the third diode circuit (D3) and the fourth diode circuit (D4) are electrically connected in series to each other.

5. The switch arrangement according to claim 3, wherein the switch arrangement comprises for each node ($N1_{D1}$, $N[i-1]_{D1}$, $N1_{D2}$, $N[i-1]_{D2}$, $N1_{D3}$, $N[i-1]_{D3}$, $N1_{D4}$, $N[i-1]_{D4}$) between two diodes of the first diode circuit (D1) and the second diode circuit (D2), and the third diode circuit (D3) and fourth diode circuit (D4), a third capacitor (C3);

each node ($N1_{D1}$, $N[i-1]_{D1}$, $N1_{D3}$, $N[i-1]_{D3}$) between two diodes of the first diode circuit (D1), and the third diode circuit (D3), is electrically connected via the respective third capacitor (C3) to a node ($N1_L$, $N[i-1]_L$) between two switches of a first part (P1) of the first series connection (SC1) between the first terminal (T1) and the center node (Nc) of the first series connection (SC1), such that the respective node between two diodes is arranged in the series connection of the diodes of the respective diode circuit (D1; D3) at the same position as the position of the node between two switches in the first part (P1) of the first series connection (SC1), to which the respective node between two diodes is electrically connected to; and each node ($N1_{D2}$, $N[i-1]_{D2}$, $N1_{D4}$, $N[i-1]_{D4}$) between two diodes of the second diode circuit (D2), and the fourth diode circuit (D4), is electrically connected via the respective third capacitor (C3) to a node ($N1_R$, $N[i-1]_R$) between two switches of a second part (P2) of the first series connection (SC1) between the center node (Nc) of the first series connection (SC1) and the second terminal (T2), such that the respective node between two diodes is arranged in the series connection of the diodes of the respective diode circuit (D2; D4) at the same position as the position of the node between two switches in the second part (P2) of the first series connection (SC1), to which the respective node between two diodes is electrically connected to.

6. The switch arrangement according to claim 1, wherein the first capacitor (C1) and the second capacitor (C2) comprise the same capacity.

7. The switch arrangement according to claim 1, wherein third capacitors (C3) electrically connected to the same node between two switches of the first series connection (SC1) comprise the same capacity.

8. The switch arrangement according to claim 1, wherein the diodes ($D1_1$, $D1_2$, $D1_i$; $D2_1$, $D2_2$, $D2_i$; $D3_1$, $D3_2$, $D3_i$; $D4_1$, $D4_2$, $D4_i$) of the switch arrangement are configured to provide a current path for a charging current for charging the first capacitor (C1) and the second capacitor (C2), when all of the switches ($S_{Li}$, $S_{L2}$, $S_{L1}$, $S_{R1}$, $S_{R2}$, $S_{Ri}$) are in the non-conducting state.

9. The switch arrangement according to claim 1, wherein for switching the switch arrangement between the conducting state and the non-conducting state, the switches ($S_{Li}$, $S_{L2}$, $S_{L1}$, $S_{R1}$, $S_{R2}$, $S_{Ri}$) are configured to be controlled such that at least two switches of the switches ($S_{Li}$, $S_{L2}$, $S_{L1}$, $S_{R1}$, $S_{R2}$, $S_{Ri}$) are not switched at the same time between the conducting state and the non-conducting state.

10. The switch arrangement according to claim 1, wherein for switching the switch arrangement between the conducting state and the non-conducting state, the switches ($S_{Li}$, $S_{L2}$, $S_{L1}$, $S_{R1}$, $S_{R2}$, $S_{Ri}$) are configured to be controlled such that the switches ($S_{Li}$, $S_{L2}$, $S_{L1}$, $S_{R1}$, $S_{R2}$, $S_{Ri}$) are switched successively one after the other, according to an order in the first series connection (SC1), between the conducting state and the non-conducting state.

11. The switch arrangement according to claim 1, wherein for switching the switch arrangement between the conducting state and the non-conducting state, the switches ($S_{Li}$, $S_{L2}$, $S_{L1}$, $S_{R1}$, $S_{R2}$, $S_{Ri}$) are configured to be controlled such that a switch of the switches electrically connected to one of the two terminals (T1, T2) is switched at first between the conducting-state and the non-conducting state.

12. A switch arrangement for a converter, wherein the switch arrangement comprises:
a first series connection (SC1) of at least two switches (SL1, SR1) between two terminals (T1, T2) of the switch arrangement, wherein the two switches (SL1, SR1) are semiconductor switches;
a second series connection (SC2) of a first capacitor (C1) and a first diode circuit (D1) electrically connected in parallel to a first part (P1) of the first series connection (SC1) between a first terminal (T1) of the two terminals (T1, T2) and a node (Nc) between the two switches (SL1, SR1), wherein the first diode circuit (D1) comprises at least one diode (D11); and
a third series connection (SC3) of a second capacitor (C2) and a second diode circuit (D2) electrically connected in parallel to a second part (P2) of the first series connection (SC1) between a second terminal (T2) of the two terminals (T1, T2) and the node (Nc) between the two switches (SL1, SR1), wherein the second diode circuit (D2) comprises at least one diode (D21),
wherein in case the first series connection comprises an even integer number of switches greater or equal to four:
two switches, which are equally apart in terms of nodes from the node (Nc) of the first series connection (SC1), are a switch pair such that the first series connection (SC1) comprises a plurality of switch pairs; and
for switching the switch arrangement between a conducting state and a non-conducting state, the switches ($S_{Li}$, $S_{L2}$, $S_{L1}$, $S_{R1}$, $S_{R2}$, $S_{Ri}$) are configured to be controlled such that
the two switches of each switch pair of the plurality of switch pairs are switched at the same time between the conducting state and the non-conducting state, and
the switch pairs of the plurality of switch pairs are switched in sequence one after the other.

13. The switch arrangement according to claim 12, wherein
for switching the switch arrangement between the conducting state and the non-conducting state, the switches ($S_{Li}$, $S_{L2}$, $S_{L1}$, $S_{R1}$, $S_{R2}$, $S_{Ri}$) are configured to be controlled such that
the two switches of each switch pair of the plurality of switch pairs are switched at the same time between the conducting state and the non-conducting state, wherein at least two switch pairs of the plurality of switch pairs are not switched at the same time between the conducting state and the non-conducting state.

14. The switch arrangement according to claim 12, wherein
for switching the switch arrangement from the conducting state to the non-conducting state, the switches ($S_{Li}$, $S_{L2}$, $S_{L1}$, $S_{R1}$, $S_{R2}$, $S_{Ri}$) are configured to be controlled such that
the switch pair comprising two switches ($S_{Li}$, $S_{Ri}$) electrically connected to the two terminals (T1, T2) of the switch arrangement or the switch pair comprising two switches ($S_{L1}$, $S_{R1}$) electrically connected to the node (Nc) of the first series connection (SC1) is switched at first from the conducting state to the non-conducting state and the other switch pairs of the plurality of switch pairs are successively switched one after the other, according to an order of the other switch pairs in the first series connection (SC1), from the conducting state to the non-conducting state; and
for switching the switch arrangement from the non-conducting state to the conducting state, the switches ($S_{Li}$, $S_{L2}$, $S_{L1}$, $S_{R1}$, $S_{R2}$, $S_{Ri}$) are configured to be controlled such that
the switch pair comprising the two switches ($S_{Li}$, $S_{Ri}$) electrically connected to the two terminals (T1, T2) of the switch arrangement or the switch pair comprising the two switches ($S_{L1}$, $S_{R1}$) electrically connected to the node (Nc) of the first series connection (SC1) is switched at first from the non-conducting state to the conducting state and the other switch pairs of the plurality of switch pairs are successively switched one after the other, according to the order of the other switch pairs in the first series connection (SC1), from the non-conducting state to the conducting state.

15. The switch arrangement according to claim 12, wherein
for switching the switch arrangement from the conducting state to the non-conducting state and from the non-conducting state to the conducting state, the switches ($S_{Li}$, $S_{L2}$, $S_{L1}$, $S_{R1}$, $S_{R2}$, $S_{Ri}$) are configured to be controlled such that the switching is started with
the switch pair comprising the two switches ($S_{Li}$, $S_{Ri}$) electrically connected to the two terminals (T1, T2) of the switch arrangement, or
the switch pair comprising the two switches ($S_{L1}$, $S_{R1}$) electrically connected to the node (Nc) of the first series connection (SC1).

16. A method for switching a switch arrangement according to claim 1 between the conducting state and the non-conducting state, wherein the method comprises the step of controlling the switches ($S_{Li}$, $S_{L2}$, $S_{L1}$, $S_{R1}$, $S_{R2}$, $S_{Ri}$) of the switch arrangement such that at least two switches of the switches ($S_{Li}$, $S_{L2}$, $S_{L1}$, $S_{R1}$, $S_{R2}$, $S_{Ri}$) are not switched at the same time between the conducting state and the non-conducting state.

17. The method according to claim 16, comprising the step of
controlling the switches ($S_{Li}$, $S_{L2}$, $S_{L1}$, $S_{R1}$, $S_{R2}$, $S_{Ri}$) of the switch arrangement such that the switches ($S_{Li}$, $S_{L2}$, $S_{L1}$, $S_{R1}$, $S_{R2}$, $S_{Ri}$) are switched successively one after the other, according to an order in the first series connection (SC1), between the conducting state and the non-conducting state.

18. The method according to claim 16, comprising the step of
controlling the switches ($S_{Li}$, $S_{L2}$, $S_{L1}$, $S_{R1}$, $S_{R2}$, $S_{Ri}$) of the switch arrangement such that a switch of the switches electrically connected to one of the two terminals (T1, T2) is switched at first between the conducting-state and the non-conducting state.

19. The method according to claim 16, wherein in case the first series connection of the switch arrangement comprises an even integer number of switches greater or equal to four, the method comprises the step of:
controlling the switches ($S_{Li}$, $S_{L2}$, $S_{L1}$, $S_{R1}$, $S_{R2}$, $S_{Ri}$) of the switch arrangement such that
the two switches of each switch pair of the plurality of switch pairs are switched at the same time between the conducting state and the non-conducting state, and
the switch pairs of the plurality of switch pairs are switched in sequence one after the other.

20. A converter system with
at least one converter comprising at least one switch arrangement for controlling power conversion by the at least one converter; wherein
the switch arrangement comprises:
a first series connection (SC1) of at least two switch pairs between two terminals (T1, T2) of the switch arrangement, wherein the at least two switch pairs comprise semiconductor switches;
a second series connection (SC2) of a first capacitor (C1) and a first diode circuit (D1) electrically connected in parallel to a first part (P1) of the first series connection (SC1) between a first terminal (T1) of the two terminals (T1, T2) and a node (Nc) between the at least two switch pairs, wherein the first diode circuit (D1) comprises at least one diode ($D1_1$); and
a third series connection (SC3) of a second capacitor (C2) and a second diode circuit (D2) electrically connected in parallel to a second part (P2) of the first series connection (SC1) between a second terminal (T2) of the two terminals (T1, T2) and the node (Nc) between the two switches ($S_{L1}$, $S_{R1}$), wherein the second diode circuit (D2) comprises at least one diode ($D2_1$),
wherein the switch arrangement is configured to provide a quasi-multilevel operation that switches the at least two switch pairs between a non-conducting state and a conducting state via at least one intermediate transient state that switches a first of at least two switch pairs before a second of the at least two switch pairs to thereby increase effective voltage capability of the at least two switch pairs between the two terminals (T1, T2) of the switch arrangement.

* * * * *